US009831209B2

(12) United States Patent
Betsui et al.

(10) Patent No.: US 9,831,209 B2
(45) Date of Patent: Nov. 28, 2017

(54) SEMICONDUCTOR DEVICE

(71) Applicant: Renesas Electronics Corporation, Koutou-ku, Tokyo (JP)

(72) Inventors: Takafumi Betsui, Tokyo (JP); Motoo Suwa, Tokyo (JP)

(73) Assignee: Renesas Electronics Corporation, Koutou-ku, Tokyo (JP)

( * ) Notice: Subject to any disclaimer, the term of this patent is extended or adjusted under 35 U.S.C. 154(b) by 1 day.

(21) Appl. No.: 15/168,550

(22) Filed: May 31, 2016

(65) Prior Publication Data
US 2017/0033070 A1  Feb. 2, 2017

(30) Foreign Application Priority Data

Jul. 31, 2015  (JP) ................. 2015-152813

(51) Int. Cl.
G06F 17/50 (2006.01)
H01L 23/00 (2006.01)
(Continued)

(52) U.S. Cl.
CPC ............ H01L 24/17 (2013.01); H01L 23/498 (2013.01); H01L 23/49838 (2013.01);
(Continued)

(58) Field of Classification Search
CPC ...................................... H01L 24/17
(Continued)

(56) References Cited

U.S. PATENT DOCUMENTS

2008/0054470 A1*  3/2008  Amano ............ H01L 21/76829
                                                       257/760
2009/0177909 A1*  7/2009  Tahara ................ G06F 13/1694
                                                       713/400
(Continued)

FOREIGN PATENT DOCUMENTS

JP        2000-260949 A      9/2000
JP        2006-229088 A      8/2006
JP        2006-269604 A     10/2006

*Primary Examiner* — Suresh Memula
(74) *Attorney, Agent, or Firm* — Sughrue Mion, PLLC

(57) ABSTRACT

Provided is a semiconductor device which can be prevented from increasing in size. The semiconductor device includes a semiconductor chip having a first main surface and a second main surface opposite to the first main surface and a wiring substrate over which the semiconductor chip is mounted such that the second main surface of the semiconductor chip faces a first main surface of the wiring substrate. Over the second main surface of the semiconductor chip, a plurality of first terminals connected with a first circuit and a plurality of second terminals connected with a second circuit are arranged. An arrangement pattern of the plurality of first terminals and an arrangement pattern of the plurality of second terminals include the same arrangement pattern. In a region of the wiring substrate where the first circuit is close to the second circuit when viewed from the first main surface of the semiconductor chip, a voltage line which supplies a power supply voltage to the first circuit is formed. In a region of the wiring substrate where the second circuit is close to the first circuit, a voltage line which supplies the power supply voltage to the second circuit is formed.

14 Claims, 13 Drawing Sheets

(51) Int. Cl.
*H01L 23/498* (2006.01)
*H01L 25/065* (2006.01)

(52) U.S. Cl.
CPC ............... *H01L 25/0655* (2013.01); *H01L 2224/16227* (2013.01); *H01L 2924/1016* (2013.01); *H01L 2924/1431* (2013.01); *H01L 2924/1432* (2013.01); *H01L 2924/1436* (2013.01); *H01L 2924/1438* (2013.01); *H01L 2924/15311* (2013.01); *H01L 2924/19041* (2013.01); *H01L 2924/19105* (2013.01)

(58) Field of Classification Search
USPC ........................................................ 716/137
See application file for complete search history.

(56) References Cited

U.S. PATENT DOCUMENTS

2010/0193953 A1* 8/2010 Amano ............. H01L 21/76831
257/751
2010/0240301 A1* 9/2010 Robert ............... H04B 7/15578
455/7

* cited by examiner

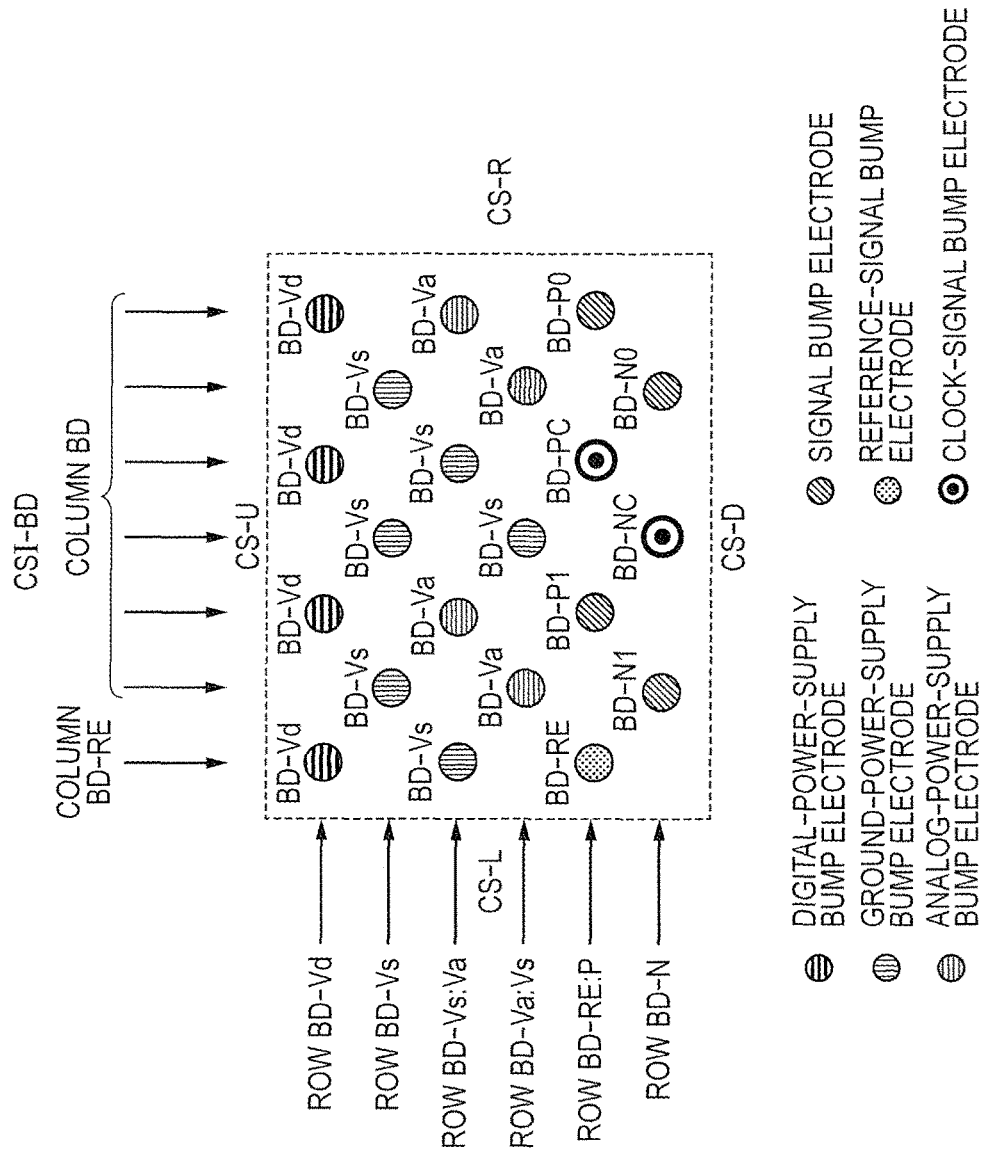

SEMICONDUCTOR DEVICE

CROSS-REFERENCE TO RELATED APPLICATIONS

The disclosure of Japanese Patent Application No. 2015-152813 filed on Jul. 31, 2015 including the specification, drawings and abstract is incorporated herein by reference in its entirety.

BACKGROUND

The present invention relates to a semiconductor device, and particularly to a semiconductor device including a plurality of semiconductor chips and a wiring substrate over which the plurality of semiconductor chips are mounted.

Techniques for integrating a plurality of semiconductor chips and a plurality of semiconductor packages into one package include SiP (Silicon in Package). Examples of the SiP include one in which a plurality of semiconductor chips and a plurality of packages are mounted over a wiring substrate and provided as a semiconductor device. In this case, the wiring substrate has a main surface (first main surface) facing the semiconductor chip mounted thereover and a main surface (second main surface) facing a user's (customer's) substrate over which the semiconductor device is mounted. Over the first main surface, a plurality of external terminals (first external terminals) to be connected with the semiconductor chips are provided. Over the second main surface, a plurality of external terminals (second external terminals) to be connected with the user's substrate are provided. The wiring substrate includes wiring a layer interposed between the first and second main surfaces. Metal wires in the wiring layer provide electrical connection between the first external terminals and/or between the first and second external terminals.

For example, by connecting the first external terminals using the metal wires, it is possible to omit wiring lines connecting the semiconductor chips from the user's substrate and reduce a load on the user. It is also possible to achieve a higher-speed operation.

On the other hand, it has been performed to combine, e.g., a plurality of hard macros having different functions to configure a semiconductor chip.

A technique which combines hard macros to configure a semiconductor chip is described in, e.g., each of Patent Documents 1 to 3.

RELATED ART DOCUMENTS

Patent Documents

[Patent Document 1]
Japanese Unexamined Patent Publication No. 2000-260949
[Patent Document 2]
Japanese Unexamined Patent Publication No. 2006-229088
[Patent Document 3]
Japanese Unexamined Patent Publication No. 2006-269604

SUMMARY

For example, as vehicles have been increasingly computerized, a control semiconductor device mounted in each of the vehicles has been requested to include a larger number of higher-speed interface circuits.

A semiconductor chip has a first main surface having a quadrangular shape in plan view and a second main surface opposite to the first main surface and similarly having a quadrangular shape in plan view. Over the second main surface, a plurality of terminals (e.g., bump electrodes) are two-dimensionally arranged. When the semiconductor chip is mounted over a wiring substrate, the plurality of bump electrodes arranged over the second main surface of the semiconductor chip are connected with the first external terminals of the wiring substrate. It follows that, via the bump electrodes connected with the first external terminals, a power-supply voltage for operating circuit blocks in the semiconductor chip is supplied and input signals are input to the interface circuits included in the circuit blocks and/or output signals are output from the interface circuits.

It is often the case that, in a semiconductor chip, to facilitate signal transmission/reception to/from interfaces between the semiconductor chip and the outside thereof, i.e., between interface circuits and the outside, the interface circuits are arranged in a peripheral region of the semiconductor chip and bump electrodes for providing electrical connection with the outside are arranged along each of the sides of a second main surface of the semiconductor chip. This allows electrical connection to be easily provided between the interface circuits in the semiconductor chip and the outside of the semiconductor chip using the bump electrodes arranged along each of the sides of the second main surface. Note that the bump electrodes arranged over the center portion of the second main surface of the semiconductor chip are used to supply, e.g., the power supply voltage to the plurality of circuit blocks in the semiconductor chip.

Examples of the interface circuits embedded in the semiconductor chip include a wide variety of interface circuits configured using hard macros. For example, a high-speed interface circuit including a differential circuit which operates using an analog power supply voltage as an operating voltage, an interface circuit which performs signal transmission/reception to/from a memory circuit provided outside the semiconductor chip, and the like are configured using hard macros.

In the case where the interface circuits are thus arranged in the peripheral region of the semiconductor chip, when a large number of the interface circuits are embedded in the semiconductor chip, the sides of the semiconductor chip may be elongated to undesirably increase the size of the semiconductor chip and increase the price (production cost) of the semiconductor device.

Each of Patent Documents 1, 2, and 3 describes a technique related to the hard macros, but has not recognized a problem resulting from the embedment of a large number of interface circuits.

The semiconductor device according to an embodiment includes a semiconductor chip, a conductive member, and a wiring substrate.

The semiconductor device includes a first circuit, a second circuit, a first main surface, a second main surface opposite and facing the first main surface, a plurality of first terminals formed two-dimensionally (planarly) over the second main surface and connected with the first circuit, and a plurality of second terminals formed two-dimensionally (planarly) over the second main surface and connected with the second circuit. A wiring substrate includes a first main surface over which a plurality of first external terminals are arranged, a wiring layer, and a second main surface over which a plurality of second external terminals are arranged, the second main surface being opposite to the first main surface via the wiring layer. A conductive member connects the first and second terminals with the first external terminals of the wiring substrate by mounting the semiconductor chip over the first main surface of the wiring substrate such that the second main surface of the semiconductor chip faces the first main surface of the wiring substrate.

When viewed from the first main surface of the semiconductor chip, an arrangement pattern of the first terminals and an arrangement pattern of the second terminals include the same arrangement pattern. When viewed from the first main surface of the semiconductor chip, the first circuit is arranged so as to be closer to a first side of the semiconductor chip than the second circuit. The first terminals include a first power supply terminal which supplies a power supply voltage to the first circuit and the second terminals include a second power supply terminal which supplies the power supply voltage to the second circuit. When viewed from the first main surface of the semiconductor chip, in a region of the first circuit which is close to the second circuit, a first power supply line which supplies the power supply voltage to the first power supply terminal is formed in the wiring layer and, in a region of the second circuit which is close to the first circuit, a second power supply line which supplies the power supply voltage to the second power supply terminal is formed in the wiring layer.

Accordingly, when viewed from the first main surface of the semiconductor chip, the first and second circuits are arranged in this order relative to the first side of the semiconductor chip. Each of the first and second circuits forms an interface circuit so that the interface circuits are arranged in a plurality of (two) zones relative to the first side. As a result, even when a large number of interface circuits are embedded in the semiconductor chip, it is possible to inhibit the first side from being elongated and prevent the size of the semiconductor chip from increasing.

When viewed from the first main surface of the semiconductor chip, the first and second power supply terminals are close to each other. Accordingly, the first and second power supply lines can be brought close to each other in the wiring layer when viewed from the first main surface of the semiconductor chip. This can achieve a reduction in the size of the wiring substrate.

According to the embodiment, it is possible to provide a semiconductor device which can be inhibited from increasing in outer size.

BRIEF DESCRIPTION OF THE DRAWINGS

FIG. 7 is a plan view showing an arrangement of bump electrodes in the MIPI-CSI standardized interface circuit according to the embodiment;

DETAILED DESCRIPTION

Figure 1:
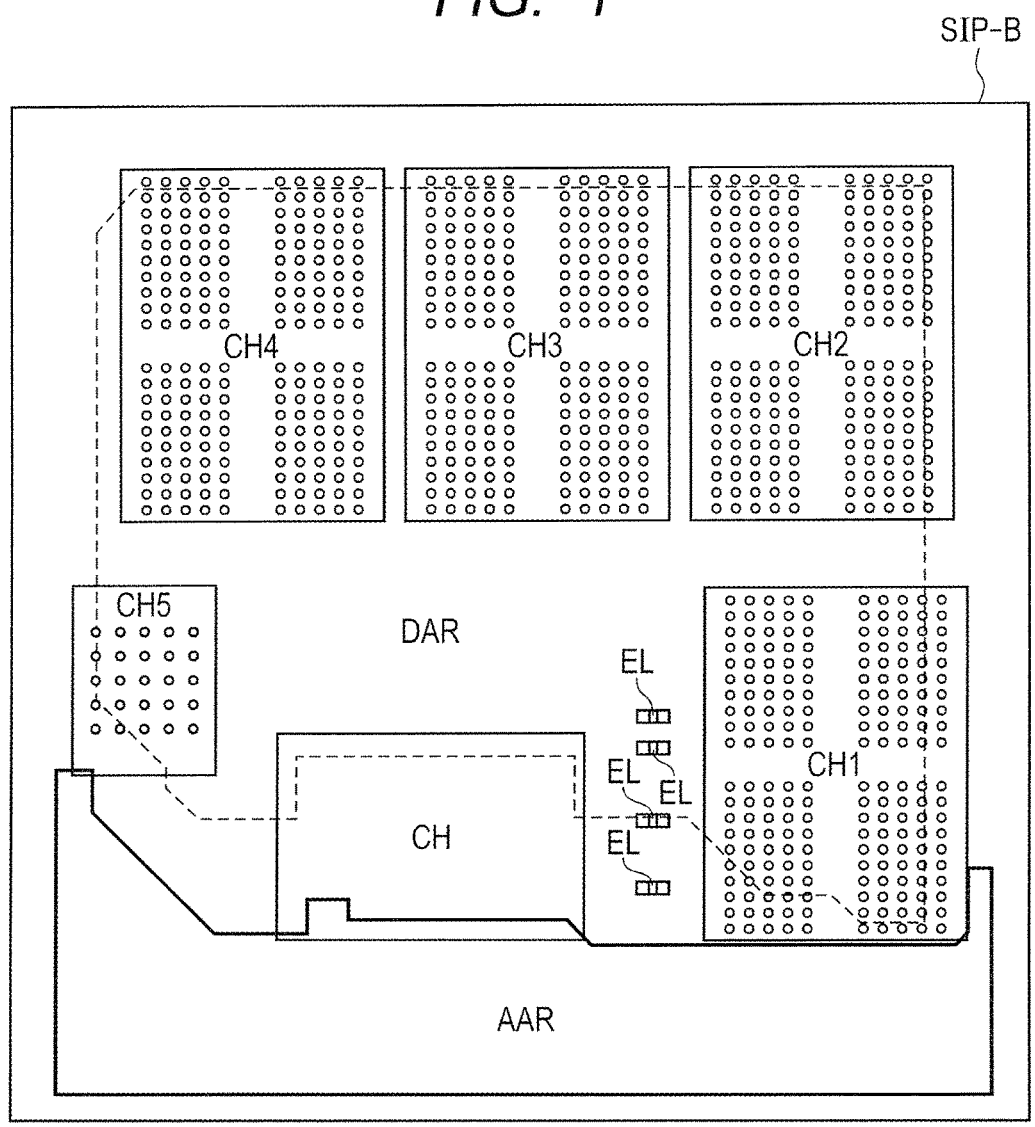
FIG. 1 is a schematic plan view showing a configuration of a semiconductor device according to an embodiment.

The following will describe an embodiment of the present invention in detail on the basis of the drawings. Note that, throughout all the drawings for illustrating the embodiments, like members are designated by like reference numerals and a repeated description thereof is omitted in principle.

Embodiment

<Outline of Configuration of Semiconductor Device>

Figure 2:
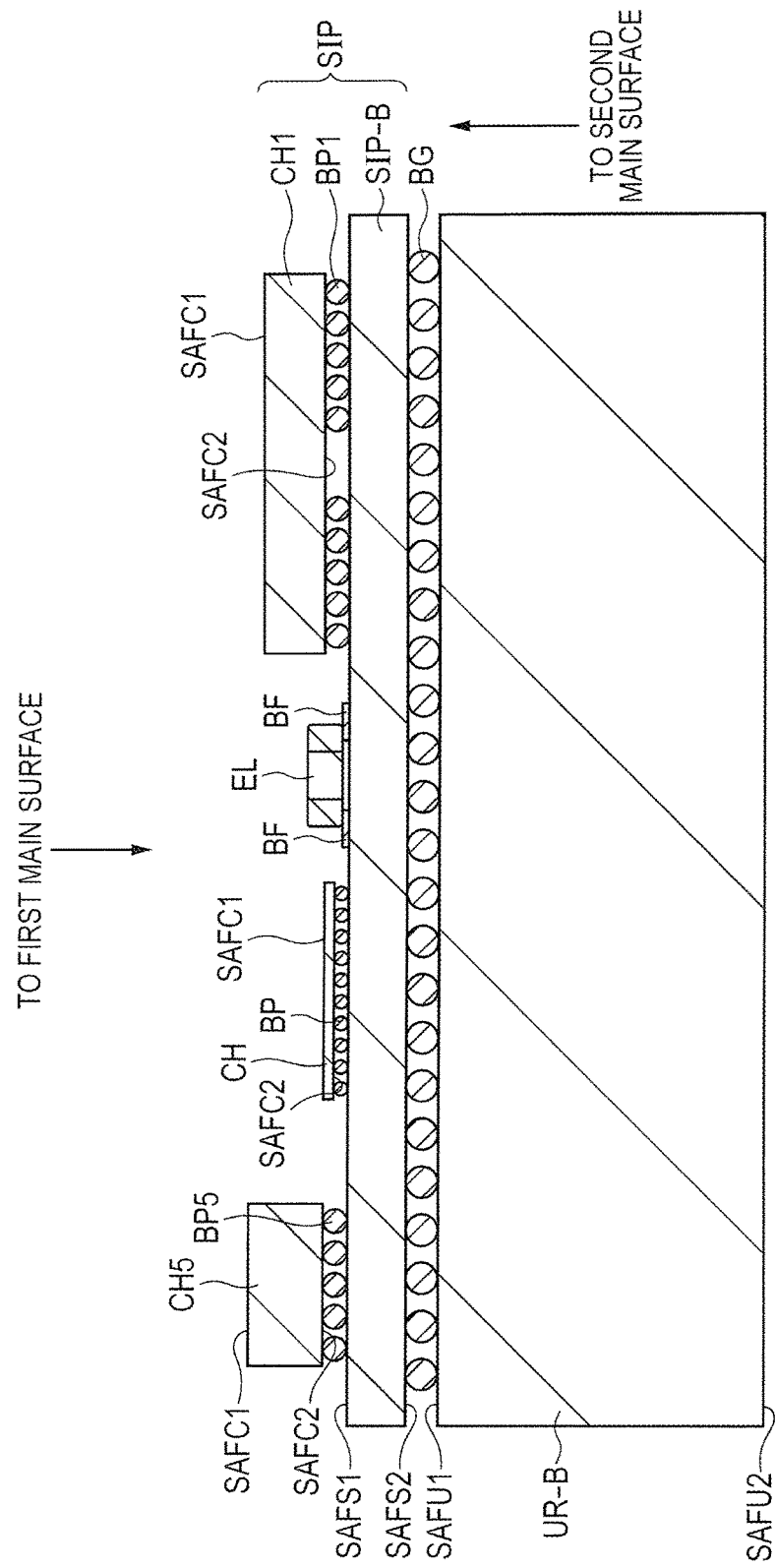
FIG. 2 is a schematic cross-sectional view showing the configuration of the semiconductor device according to the embodiment.

FIG. 1 is a schematic plan view showing a configuration of a semiconductor device SIP according to an embodiment. FIG. 2 is a schematic cross-sectional view showing the configuration of the semiconductor device SIP according to the embodiment. First, using FIGS. 1 and 2, the configuration of the semiconductor device SIP according to the embodiment will be described using FIGS. 1 and 2.

In FIG. 1, CH denotes a semiconductor chip and CH1 to CH5 denote semiconductor packages. Also, EL denotes each of electronic components such as a capacitor and SIP-B denotes a wiring substrate. In each of the semiconductor packages CH1 to CH5 mentioned herein, a semiconductor chip is molded in, e.g., a resin. By way of example, FIG. 2 shows a cross section of each of the semiconductor chip CH shown in FIG. 1, the semiconductor packages CH1 and CH5 among the semiconductor packages CH1 to CH5 shown in FIG. 1, and one of the three electronic components EL shown in FIG. 1.

In the semiconductor chip CH, various circuit blocks are formed in a semiconductor substrate (chip) using a known manufacturing technique. Likewise, each of the semiconductor packages CH1 to CH5 includes a semiconductor substrate (chip) in which various circuit blocks are formed using a known manufacturing technique. In each of the semiconductor packages CH1 to CH5, the semiconductor substrate is molded in a resin or the like. As shown in FIG. 2, the semiconductor chip CH has a first main surface SAFC1 and a second main surface SAFC2 opposite to the first main surface SAFC1. Over the second main surface SAFC2 (FIG. 2) of the semiconductor chip CH, a plurality of bump electrodes (not shown and hereinafter referred to also as terminals) are formed. The various circuit blocks are connected with the corresponding bump electrodes. As shown in FIG. 2, each of the semiconductor packages CH1 to CH5 includes the first main surface SAFC1 and the second main surface SAFC2 opposite to the first main surface SAFC1. The circuit blocks in the semiconductor chip in each of the semiconductor packages CH1 to CH5 are connected with a plurality of bump electrodes (not shown) formed over the second main surface SAFC2.

A semiconductor substrate SIP-B includes the first main surface SAFS1, the second main surface SAFS2, and a wiring layer. In FIG. 2, the first and second main surfaces SAFS1 and SAFS2 of the wiring substrate SIP-B are shown. The semiconductor chip CH and the semiconductor packages CH1 to CH5 are mounted over the wiring substrate SIP-B such that the second main surface SAFC2 of each of the semiconductor chip CH and the semiconductor packages CH1 to CH5 faces the first main surface SAFS1 of the wiring substrate SIP-B. FIG. 2 shows a state where only the semiconductor chip CH and the semiconductor packages CH1 and CH5 are mounted over the wiring substrate SIP-B. However, the other semiconductor packages CH2 to CH4 are also similarly mounted over the wiring substrate SIP-B.

Over the first main surface SAFS1 of the wiring substrate SIP-B, a plurality of first external terminals (not shown) are provided. Between the plurality of first external terminals and the bump electrodes provided over the second main surface SAFC2 of each of the semiconductor chip CH and the semiconductor packages CH1 to CH5, bumps (conductive members) BP and BP1 to BP5 each shown by the circular mark are formed. The bumps BP and BP1 to BP5 electrically connect the plurality of bump electrodes over the second main surface SAFC2 of each of the semiconductor chip CH and the semiconductor packages CH1 to CH5 with the plurality of first external terminals over the first main surfaces SAFS1 of the wiring substrate SIP-B. Note that, in FIG. 2, the bumps BP and the bumps BP1 to BP5 are illustrated to have different sizes. However, the sizes of the bumps BP and the bumps BP1 to BP5 may also be the same.

Over the second main surface SAFS2 of the wiring substrate SIP-B, a plurality of second external terminals are provided, though not shown. Between the first and second main surfaces SAFS1 and SAFS2 of the wiring substrate SIP-B, the wiring layer are interposed. As will be described later using FIG. 3, the wiring layer include a plurality of metal wiring layers (conductive wiring layers) and insulating layers. Wiring lines formed of the metal wiring layers (conductive wiring layers) in the wiring layer electrically connect the first external terminals provided over the first main surface SAFS1 with each other or electrically connect the first external terminals provided over the first main surface SAFS1 with the second external terminals provided over the second main surface SAFS2. That is, the wiring lines in the wiring layer electrically connect the intended first external terminals with each other or electrically connect the intended first external terminals with the intended second external terminals.

In FIG. 2, UR-B denotes a user's substrate (hereinafter referred to also as the user substrate). The user substrate UR-B includes a first main surface SAFU1, a second main surface SAFU2, and a wiring layer interposed between the first and second main surfaces SAFU1 and SAFU2. The wiring substrate SIP-B is mounted over the user substrate UR-B such that the second main surface SAFS2 faces the first main surface SAFU-1 of the user substrate UR-B. Over the first main surface SAFU1 of the user substrate UR-B also, a plurality of user first external terminals not shown are provided and, over the second main surface SAFU2 also, a plurality of user second external terminals not shown are provided. The wiring lines formed of the conductive wiring layers in the wiring layer interposed between the first and second main surfaces SAFU1 and SAFU2 electrically connect the intended user first external terminals with each other or electrically connect the intended user first external terminals with the intended user second external terminals.

The user first external terminals provided over the first main surface SAFU1 of the user substrate UR-B are electrically connected with the second external terminals provided over the second main surface SAFS2 of the wiring substrate SIP-B via a plurality of bumps (conductive members) BG each shown by the circular mark in FIG. 2. As a result, e.g., the bump electrodes of the semiconductor chip CH are electrically connected with the user second external terminals over the second main surface SAFU2 of the user substrate UR-B.

In FIGS. 1 and 2, each of the electronic components EL shows a capacitor. The capacitor has terminals BE electrically connected with the first external terminals provided over the first main surface SAFS1 of the wiring substrate SIP-B. Each of the capacitors (electronic components EL) shown in FIGS. 1 and 2 shows a bypass capacitor for stabilizing the power supply voltage, though the capacitors are not particularly limited.

In FIG. 1, by way of example, each of the bumps provided between the bump electrodes provided over the second main surface SAFC2 of each of the semiconductor packages CH1 to CH5 and the first external terminals provided over the first main surface SAFS1 of the wiring substrate SIP-B is shown by the circular mark. In the semiconductor chip CH also, a plurality of bumps are similarly provided between the bump electrodes provided over the second main surface SAFC2 of the semiconductor chip CH and the first external terminals provided over the first main surface SAFS1 of the wiring substrate SIP-B, though not shown in FIG. 1.

In the example shown in FIGS. 1 and 2, the bump electrodes provided over the second main surfaces SAFC2 of the semiconductor chip and the semiconductor packages are electrically connected with the first external terminals provided over the first main surface SAFS1 of the wiring substrate SIP-B via the bumps. However, connecting members are not limited to the bumps as long as electrical connection can be provided. Likewise, connecting members between the second external terminals over the second main surface SAFS2 of the wiring substrate SIP-B and the user first external terminals over the first main surface SAFU1 of the user substrate UR-B are also not limited to bumps as long as electrical connection can be provided.

In the embodiment, the semiconductor chip CH is a semiconductor chip in which a microprocessor and a plurality of high-speed interface circuits are embedded as circuit blocks, though the semiconductor chip CH is not particularly limited. Each of the semiconductor packages CH1 to CH4 is a semiconductor package formed by molding a semiconductor chip in which a dynamic-type memory is embedded as a circuit block. The semiconductor package CH5 is a semiconductor package formed by molding a semiconductor chip in which an electrically rewritable non-volatile memory (flash memory) is embedded as a circuit block. Over the first main surface SAFS1 of the wiring substrate SIP-B, the plurality of semiconductor chips CH and the semiconductor packages CH1 to CH5 are arranged in parallel. Accordingly, the area of the first main surface SAFS1 of the wiring substrate SIP-B is larger than the respective areas of the second main surfaces SAFC2 of the semiconductor chip CH and the semiconductor packages CH1 to CH5. In addition, since the second and first main surfaces SAFS2 and SAFS1 of the wiring substrate SIP-B extend in parallel, the area of the second main surface SAFS2 of the wiring substrate SIP-B is also larger than the respective areas of the second main surfaces SAFC2 of the semiconductor chip CH and the semiconductor packages CH1 to CH5.

In FIG. 1, a region DAR enclosed by the broken line and a region AAR enclosed by the solid line schematically show the types of wiring lines in the wiring substrate SIP-B. Each of the wiring lines in the wiring layer of the wiring substrate SIP-B shown by the region DAR is used mainly to supply a digital power supply voltage for operating the semiconductor chip CH and the semiconductor packages CH1 to CH5 and transmit a digital signal. By contrast, each of the wiring lines in the wiring layer of the wiring substrate SIP-B shown by the region AAR is used mainly to supply an analog power supply voltage for operating the high-speed interface circuits in the semiconductor chip CH and transmit an analog signal.

In the present specification, a view obtained when an object is viewed from top down in FIG. 2 will be described as a top view. When a description is given using the semiconductor chip CH, the semiconductor packages CH1 to CH5, and the wiring substrate SIP-B as a reference, the description will be given on the assumption that the case where the first main surface SAFC1 of each of the semiconductor chip CH and the semiconductor packages CH1 to CH5 and the first main surface SAFS1 of the wiring substrate SIP-B are viewed from above in FIG. 2 corresponds to the case where an object is viewed from the first main surface (first main surface). Likewise, the description will be given on the assumption that the case where the second main surface SAFC2 of each of the semiconductor chip CH and the semiconductor packages CH1 to CH5 and the second main surface SAFS2 of the wiring substrate SIP-B are viewed from below in FIG. 2 corresponds to the case where an object is viewed from the second main surface (second main surface).

Figure 3:
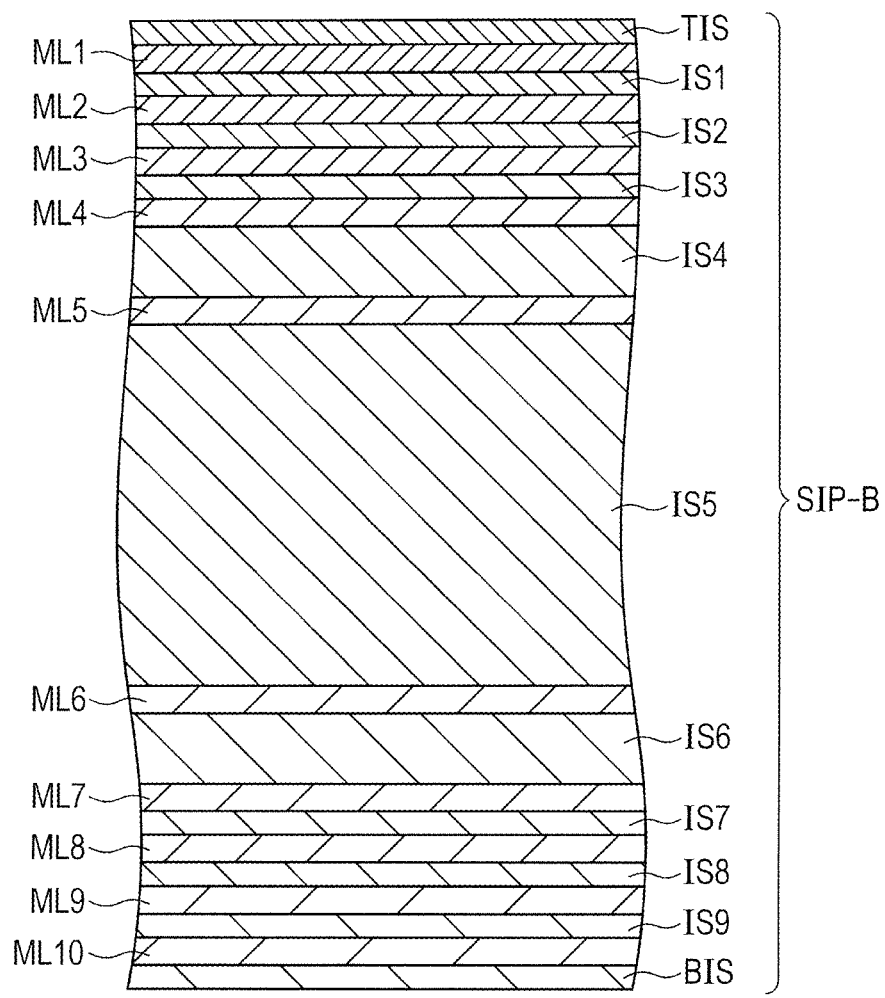
FIG. 3 is a cross-sectional view showing a cross section of a wiring substrate according to the embodiment.

FIG. 3 is a cross-sectional view showing a cross section of the wiring substrate SIP-B according to the embodiment. In FIG. 3, TIS denotes a top insulating film, BIS denotes a bottom insulating film, and each of IS2 to IS9 denotes an insulating layer. Also, ML1 to ML10 denote metal wiring layers (conductive wiring layers). In short, the wiring substrate SIP-B includes the top insulating film TIS, the bottom insulating film BIS, the metal wiring layers ML1 to ML10, and the insulating layers IS1 to 159. The plurality of metal wiring layers ML1 to ML10 and the plurality of insulating films IS1 to IS9 are interposed between the top insulating film TIS and the bottom insulating film BIS. The metal wiring layers ML1 to ML10 and the insulating layers IS1 to IS9 are alternately arranged. In other words, the metal wiring layers ML1 to ML10 and the insulating layers 151 to IS9 are alternately stacked. This provides electrical isolation between the metal wiring layers ML1 to ML10. The first main surface SAFS1 of the wiring substrate SIP-B corresponds to the top insulating film TIS side, while the second main surface SAFS2 of the wiring substrate SIP-B corresponds to the bottom insulating film BIS side.

When the first external terminals provided over the first main surface SAFS1 of the wiring substrate SIP-B are connected with each other, openings are provided in intended portions of the top insulating film TIS and electrodes serving as the first external terminals are formed, though not shown in FIG. 3. Also, in intended portions of intended layers (one or a plurality of layers) of the insulating film IS1 to IS9, openings are provided. By filling the provided openings with metal, intended metal wiring layers are electrically connected. As a result, metal wiring lines which electrically connect the first external terminals with each other are formed. Likewise, when the first external terminals provided over the first main surface SAFS1 are connected with the second external terminals provided over the second main surface SAFS2, in intended portions of the top insulating film TIS and the bottom insulating film BIS, openings are provided and electrodes serving as the first and second external terminals are formed. Also, in intended portions of intended layers (one or a plurality of layers) of the insulating films IS1 to IS9, openings are provided. By filling the provided openings with metal, intended metal wiring lines are formed. This allows the first external terminals and the second external terminals to be electrically connected with each other.

From another perspective, it can also be considered that, when the openings are provided in the top insulating film TIS and the bottom insulating film BIS, the regions of the metal wiring layers which are exposed through the openings correspond to the first and second external terminals.

In the region DAR shown in FIG. 1, e.g., the second and fourth metal wiring layers ML2 and ML4 are used as wiring lines for mainly transmitting the digital signal, while the remaining metal wiring layers ML1, ML3, and ML5 to ML10 are used as wiring lines for mainly supplying the digital power supply voltage and a ground voltage. By contrast, in the region AAR shown in FIG. 1, e.g., the second metal wiring layer ML2 is used as a wiring line for mainly transmitting a high-speed interface signal, while the remaining metal wiring layers ML1 and ML3 to ML10 are used as wiring lines for mainly supplying the analog power supply voltage and the ground voltage.

In the embodiment, the wiring substrate SIP-B is formed by stacking three built-up layers over each of the two surfaces of a four-layer core substrate. When a description is given with reference to FIG. 3, the four-layer core substrate is formed of the four metal wiring layers ML4 to ML7. Among the four metal wiring layers ML4 to ML7, the metal wiring layer ML4 is the top core layer and provides the first main surface of the core substrate and the metal wiring layer ML7 facing the metal wiring layer ML4 serving as the first main surface is the bottom core layer and provides the second main surface of the core substrate. The core substrate is the four-layer core substrate in which the two metal wiring layers ML5 and ML6 are interposed between the metal wiring layer ML4 providing the first main surface (top core layer) and the metal wiring layer ML7 providing the second main surface (bottom core layer).

Over the metal wiring layer ML4 providing the first main surface of the four-layer core substrate, the three build-up layers are stacked while, over the metal wiring layer ML7 providing the second main surface of the four-layer core substrate, the three build-up layers are stacked. In FIG. 3, the three build-up layers stacked over the first main surface of the core substrate are shown as the metal wiring layers ML3 and ML1 and the three build-up layers stacked over the second main surface of the core substrate are shown as the metal wiring layers ML8 to ML10.

The processing accuracies of the core layers and the build-up layers depend on the manufacturing process. In general, a build-up layer has a higher processing accuracy and need not use a thick and long penetrating through hole. For this reason, a high-speed signal line which transmits a high-speed signal is preferably formed using a build-up layer. Accordingly, in this embodiment, each of the signal lines which transmit the digital signal and the high-speed interface signal is formed of the second metal wiring layer ML2 as the build-up layer, though the signal lines which transmit the digital signal and the high-speed interface signal are not limited thereto.

<Configuration of Semiconductor Chip (Terminal Arrangement)>

Figure 4:
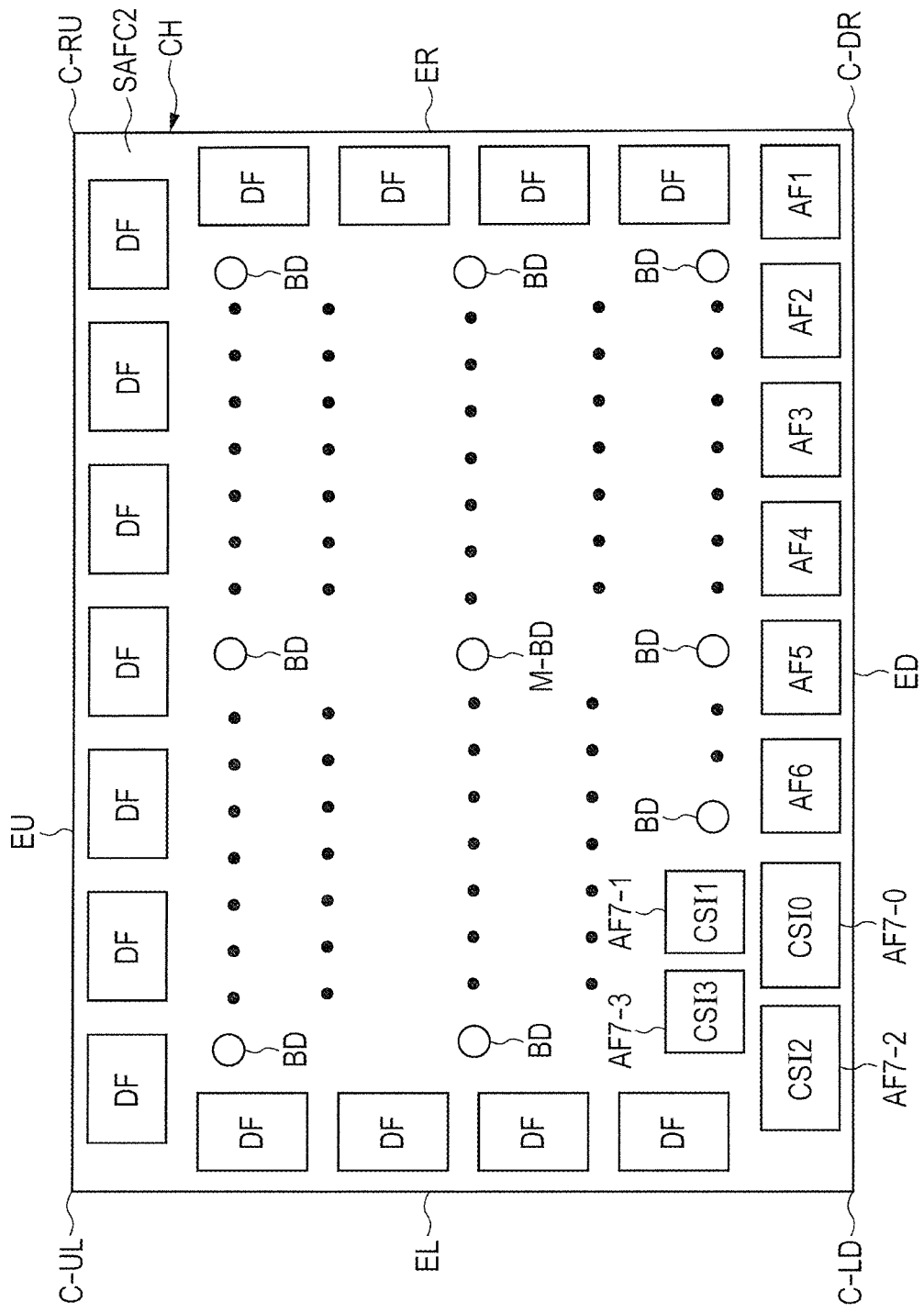
FIG. 4 is a plan view showing a configuration of a semiconductor chip according to the embodiment.

FIG. 4 is a plan view showing a configuration of the semiconductor chip according to the embodiment. In FIG. 4, a plan view of the semiconductor chip CH including a microprocessor and the interface circuits is shown. FIG. 4 shows bump electrodes arranged over the second main surface SAFC2 of the semiconductor chip CH when viewed from the first main surface SAFC1. In other word, in FIG. 4, the arrangement of the bump electrodes over the second main surface SAFC2 of the semiconductor chip CH is shown through the semiconductor chip CH.

The second main surface SAFC2 of the semiconductor chip CH has four sides EU, ED, ER, and EL. That is, the second main surface SAFC2 is enclosed by the four sides. Among them, the sides EU and ED extend in parallel with each other and the sides ER and EL also extend in parallel with each other. The sides EU and ED intersect the sides ER and EL. Also, in the drawing, C-RU denotes a corner portion formed by the sides EU and ER intersecting each other and C-DR denotes a corner portion formed by the sides ER and ED intersecting each other. Likewise, C-LD denotes a corner portion formed by the sides ED and EL intersecting each other and C-UL denotes a corner portion formed by the sides EL and EU intersecting each other.

It can be considered that the sides EU, ER, ED, and EL of the second main surface SAFC2 show the respective sides of the semiconductor chip CH. Likewise, the corner portions C-RU, C-DR, C-LD, and C-UL of the second main surface SAFC2 show the individual corner portions of the semiconductor chip CH. Also, as shown in FIG. 4, the semiconductor chip CH has a quadrangular shape in plan view when viewed from the first main surface SAFC1.

Over the second main surface SAFC2 of the semiconductor chip CH, a plurality of bump electrodes are two-dimensionally (planarly) regularly arranged. Among the plurality of bump electrodes arranged over the second main surface SAFC2, bump electrodes BD two-dimensionally regularly arranged over the center portion of the second main surface SAFC2 are used as bump electrodes to which the digital power supply voltage is supplied. On the other hand, the bump electrodes arranged along each of the sides EU, ED, ER, and EL are used as bump electrodes for transmitting/receiving the interface signal and bump electrodes to which the power supply voltage for the interface circuits is supplied. In other words, between each of the sides and the bump electrodes BD to which the digital power supply voltage is supplied, the bump electrodes for the interface circuits are arranged. To avoid complicated illustration, in FIG. 4, the nine bump electrodes BD to which the digital power supply voltage is supplied are clearly shown as representatives. Note that, in the example shown in FIG. 4, the bump electrode is arranged at the center of the second main surface SAFC2 of the semiconductor chip CH and M-BD particularly shows the bump electrode arranged at the center.

The semiconductor chip CH includes the plurality of interface circuits of mutually different types as interface circuits. The semiconductor chip CH includes, e.g., a digital signal interface circuit which outputs, inputs, or inputs/outputs a control signal from the microprocessor, the digital signal interface circuit used for data transmission/reception between the microprocessor and the other semiconductor packages CH1 to CH5, the high-speed interface circuits, and the like.

Each of the high-speed interface circuits includes a differential circuit which operates with the analog power supply voltage. An example of a configuration of the high-speed interface circuit will be described later.

In the semiconductor chip CH according to the embodiment, the bump electrodes of the digital signal interface circuits are arranged along each of the sides EU, EL, and ER. Also, the bump electrodes of the high-speed interface circuits are arranged along the side ED. In FIG. 4, to avoid complicated illustration, the bump electrodes of the digital signal interface are not shown individually, but the region where the plurality of bump electrodes are arranged is shown as a terminal (bump electrode) region DF. Likewise, the bump electrodes of the high-speed interface circuits are also not shown individually, but the regions where the plurality of bump electrodes are arranged are shown as terminal (bump electrode) regions AF1 to AF6 and AF7-0 to AF7-3.

In the embodiment, the semiconductor chip CH includes, as the high-speed interface circuits, six types of interface circuits described below, though the high-speed interface circuits are not particularly limited. That is, the semiconductor chip CH includes, as the interface circuits, the Universal Serial Bus (hereinafter referred to also as USB) standardized interface circuit and the High-Definition Multimedia Interface (hereinafter referred to also as HDMI (registered trademark)) standardized circuit. The semiconductor chip CH also includes, as the interface circuits, the LVDS (Low Voltage Differential Signaling) technology interface circuit, the eSATA (external Serial ATA) technology interface circuit, the PCIe (PCI Express) standardized interface circuit, and the MIPI-CSI standardized interface circuit.

FIG. 4 shows the case where interface circuits corresponding to a plurality of lanes (a plurality of channels) are provided as the MIPI-CSI standardized interface circuits, the interface circuits corresponding to two channels are provided as the USE standardized interface circuits, and the interface circuit corresponding to one channel is provided as each of the remaining high-speed interface circuits. That is, FIG. 4 shows the case where the semiconductor chip CH has the plurality of MIPI-CSI standardized interface circuits which are among the high-speed interface circuits, the two USB standardized interface circuits which are among the high-speed interface circuits, and the remaining high-speed interface circuits of mutually different types.

In FIG. 4, in the terminal region API which is among the terminal regions API to AF6 and AF7-0 to AF7-3, the plurality of bump electrodes corresponding to the first-channel USB standardized interface circuit are arranged. In the terminal region AF2, the plurality of bump electrodes corresponding to the second-channel USE standardized interface circuit are arranged. Likewise, in the terminal region AF3, the plurality of bump electrodes corresponding to the PCIe standardized interface circuit are arranged. In the terminal region SF4, the plurality of bump electrodes corresponding to the HDMI standardized interface circuit are arranged. In the terminal region AF6, the plurality of bump electrodes corresponding to the LVDS technology interface circuit are arranged.

The semiconductor chip CH according to the embodiment has the four MIPI-CSI standardized interface circuits. As will be described later using FIG. 5, in this embodiment, the four MIPI-CIS standardized interface circuits CSI0 to CSI3 are arranged in two pairs. That is, the four MIPI-CSI standardized interface circuits are divided into the MIPI-CSI standardized interface circuits CSI0 and CSI2 (first and third circuits) arranged close to the side ED and the MIPI-CSI standardized interface circuits CSI1 and CSI3 (second and fourth circuits) arranged more distant from the side ED than the MIPI-CSI standardized interface circuits CSI0 and SCI2. In other words, the MIPI-CSI standardized interface circuits CSI0 and CSI2 are arranged closer to the side ED than the MIPI-CSI standardized interface circuits CSI1 and CSI3.

From another perspective, when the side ED is used as a reference, the interface circuits are arranged in two zones. In this case, the interface circuits CSI0 and CSI2 arranged close to the side ED correspond to the first zone. On the other hand, the interface circuits CSI1 and CSI3 arranged closer to the center portion of the semiconductor chip than the interface circuits CSI0 and CSI2 (or arranged further away from the side ED than the interface circuits CSI0 and CSI2) correspond to the second zone.

In accordance with the arrangement of these interface circuits CSI0 to CSI3, the bump electrodes corresponding thereto are also arranged over the second main surface SAFC2. That is, the bump electrodes corresponding to the interface circuits CSI0 and CSI2 are arranged in the terminal regions AF7-0 and AF7-2 located close to the side ED. On the other hand, the bump electrodes corresponding to the interface circuits CSI1 and CSI3 are arranged in the terminal regions AF7-1 and AF7-3 arranged distant from the side ED than the terminal regions AF7-0 and AF7-2. From another perspective, it can be considered that the bump electrodes corresponding to the MIPI-CSI standardized interface circuits are also arranged in two zones when the side ED is used as a reference.

That is, the bump electrodes corresponding to the interface circuit CSI0 are arranged in the first-zone terminal region AF7-0 close to the side ED and the bump electrodes corresponding to the interface circuit CSI2 are also arranged in the first-zone terminal region AF7-2 close to the side ED. By contrast, the bump electrodes corresponding to the interface circuit CSI1 are arranged in the second-zone terminal region AF7-1 distant (away) from the side ED and the bump electrodes corresponding to the interface circuit CSI3 are also arranged in the second-zone terminal region AF7-3 distant (away) from the side ED.

This can prevent the side ED of the semiconductor chip CH from becoming longer than when all the interface circuits are arranged along the side ED. As a result, it is possible to inhibit the size of the semiconductor chip CH from increasing.

Note that the semiconductor chip CH according to the embodiment has the two USB standardized interface circuits. This allows, in the semiconductor chip CH, the USB standardized interface circuits to be provided in two zones in place of the MIPI-CSI standardized interface circuits. However, in the USB 3.0 standard and the USB 2.0 standard, a maximum data transfer speed is higher than a data transfer speed in the MIPI-CSI standard. Since the data transfer speed is high, compared to the case where the MIPI-CSI interface circuits are provided in two zones, it is requested to give consideration to the placement of signal lines which transfer data or the like. In addition, to operate the interface circuits which satisfy the USB 3.0 standard, the USB 2.0 standard, and the USB 1.1 standard, three types of analog power supply voltages compliant with the individual standards are needed. By contrast, in the MIPI-CSI standardized interface circuit, e.g., only one type of analog power supply voltage is sufficient. Therefore, the placement of the analog power supply voltage lines is easier when the MIPI-CSI standardized interface circuits are provided in two zones which are arranged in a direction from the side ED toward the center portion of the semiconductor chip CH.

To achieve this, it is desirable to provide the MIPI-CSI standardized interface circuits in two zones (multiple zones), as shown in FIG. 4. However, in FIG. 4, the USB standardized interface circuits may also be arranged in multiple zones.

The terminal regions AF7-0 to AF7-3 where the bump electrodes corresponding to the interface circuits CSI0 to CSI3 are arranged are arranged in the portion closer to the corner portion C-LD which is among the four corner portions C-RU, C-DR, C-LD, and C-UL. This can improve the degree of freedom of wiring lines in the wiring substrate SIP-B, as will be described later.

<Configuration in Semiconductor Chip (Circuit Blocks)>

Figure 5:
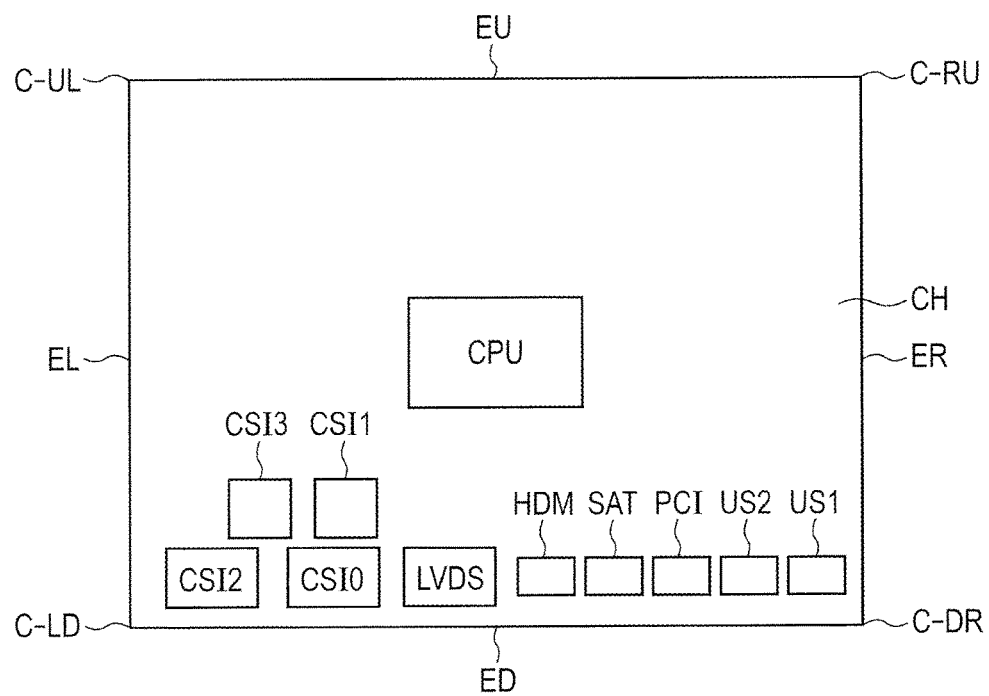
FIG. 5 is a block diagram showing the configuration of the semiconductor chip according to the embodiment.

Next, a configuration in the semiconductor chip CH will be described. FIG. 5 is a block diagram showing the configuration in the semiconductor chip CH according to the embodiment. The semiconductor chip CH includes a plurality of circuit blocks but, in FIG. 5, only the microprocessor CPU and the high-speed interface circuits are shown as representatives.

FIG. 5 schematically illustrates the arrangement of the circuit blocks when the semiconductor chip CH is viewed from the first main surface SAFC1 in accordance with the real arrangement thereof. That is, in FIG. 5, the interface circuits described next are illustrated in accordance with the real arrangement of the interface circuits in the semiconductor chip CH.

In the drawing, the microprocessor CPU operates in accordance with the program stored in a memory not shown. During the operation, the microprocessor CPU performs data transmission/reception to/from the semiconductor packages CH1 to CH5 via, e.g., a digital interface circuit, the bump electrodes in the terminal region DF (FIG. 4) corresponding to the digital interface circuit, and the wiring lines in the wiring layer to perform a predetermined process. The microprocessor CPU also performs signal transmission/reception to/from the outside of the semiconductor device SIP via the high-speed interface circuits and the bump electrodes in the terminal regions AF1 to AF6 and AF7-0 to AF7-3 (FIG. 4) corresponding to the high-speed interface circuits in accordance with a program.

In FIG. 5, US1 and US2 denote the USB standardized interface circuits. The interface circuit US1 is the first-channel USB standardized interface circuit and the interface circuit US2 is the second-channel USB standardized interface circuit. In FIG. 5, PCI denotes the PCIe standardized interface circuit, SAT denotes the eSATA technology interface circuit, and HDM denotes the HDMI standardized interface circuit. Also, LVDS denotes the LVDS technology interface circuit and CSI0 to CSI3 denote the MIPI-CSI standardized interface circuits. Each of the interface circuits CSI0 to CSI3 is, e.g., a MIPI-CSI standardized interface circuit corresponding to a plurality of lanes.

In FIG. 5, the circuit blocks of the interface circuits LVDS and CSI0 to CSI3 are shown larger than those of the other interface circuits. However, this is for the sake of convenience of description and the size relationship between the circuit blocks is not limited thereto.

The high-speed interface circuits US1, US2, PCI, SAT, HDM, LVDS, CSI0, and CSI2 are arranged along the side ED of the semiconductor chip CH. The interface circuits CSI1 and CSI3 are also arranged along the side ED of the semiconductor chip CH such that the interface circuits CSI0 and CSI2 are interposed between the interface circuits CSI1 and CSI3 and the side ED. Consequently, the interface circuits CSI1 and CSI3 are located further away from the side ED than the interface circuits CSI0 and CSI2. That is, when the side ED is used as a reference, the interface circuits CSI0 to CSI3 are arranged in two zones. In the region close to the corner portion C-LD which is among the four corner portions C-RU, C-DR, C-LD, and C-UL, the interface circuits CSI0 to CSI3 are arranged in two zones.

These interface circuits US1, US2, PCI, SAT, HDM, LVDS, and CSI0 to CSI3 have inputs or outputs which are connected with the bump electrodes arranged in the corresponding terminal regions AF1 to AF6 and AF7-0 to AF7-3 shown in FIG. 4.

<Configuration of High-Speed Interface Circuits>

Figure 6:
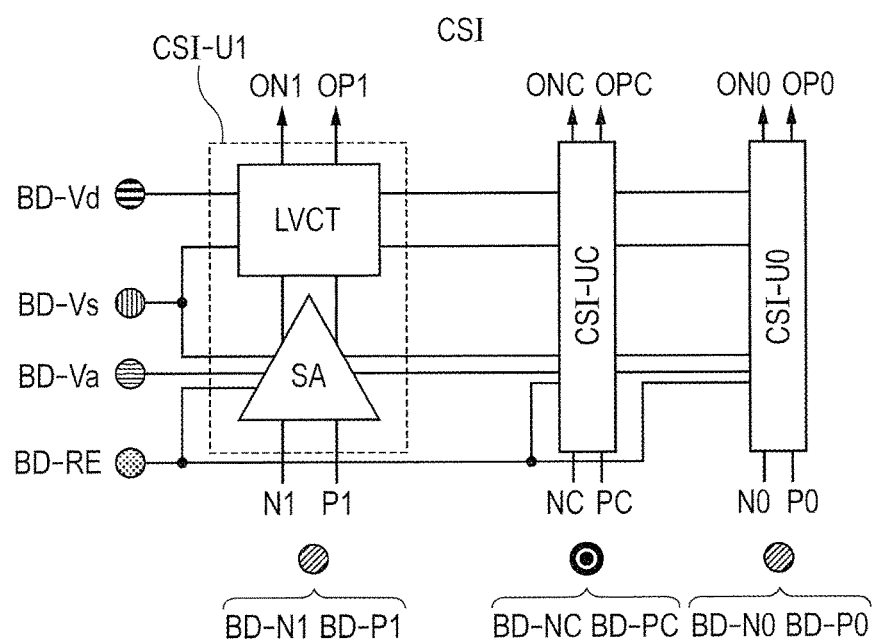
FIG. 6 is a block diagram showing a configuration of a MIPI-CSI standardized interface circuit according to the embodiment.

Next, a configuration of the high-speed interface circuits will be described. The configuration of the MIPI-CSI standardized interface circuits is described herein using FIGS. 6 and 7. FIG. 6 is a block diagram showing the configuration of the MIPI-CSI standardized interface circuits CSI corresponding to two lanes. FIG. 7 is a plan view showing an arrangement of the bump electrodes (terminals) corresponding to the MIPI-CSI standardized interface circuits CSI shown in FIG. 6.

First, using FIG. 6, a description will be given of the MIPI-CSI standardized interface circuits CSI. FIG. 6 shows only unit circuit portions CSI-U0, CSI-U1, and CSI-UC as the portions of the MIPI-CSI standardized interface circuit CSI which correspond to the bump electrodes. Output signals ON0, OP0, ON1, OP1, ONC, and OPC from these unit circuit portions CSI-U0, CSI-U1, and CSI-UC are supplied to a processing circuit portion not shown. From the processing circuit portion, the output signals from the interface circuits CSI are supplied to, e.g., the microprocessor CPU.

The unit circuit portions CSI-U0, CSI-U1, and CSI-UC have identical configurations, though the configurations thereof are not particularly limited. Accordingly, the unit circuit portion CSI-U1 will be described herein as a representative. In FIG. 6, SA denotes a differential circuit and LVCT denotes a level conversion circuit. To the differential circuit SA, a pair of differential signals (complementary signals) N1 and P1 are supplied as input signals. The differential circuit SA has a characteristic thereof determined in accordance with the value of a reference signal REXT. The pair of differential signals amplified by the differential circuit SA are supplied to the level conversion circuit LVCT. The level-converted output signals ON1 and OP1 are supplied to a processing circuit portion not shown. In short, the unit circuit portion CSI-U1 receives the pair of differential signals N1 and P1 and outputs the level-converted output signals ON1 and OP1 in correspondence to the pair of differential signals N1 and P1.

Likewise, the unit circuit portion CS1-U0 receives a pair of differential signals N0 and P0 and outputs the pair of differential output signals ON0 and OP0 corresponding to the received differential signals. Also, the unit circuit portion CSI-UC receives a pair of differential clock signals NC and PC and outputs the pair of differential output clock signals ONC and OPC corresponding to the pair of differential clock signals NC and PC.

To the MIPI-CSI standardized interface circuit CSI, an output signal from, e.g., a camera and a clock signal are supplied as an input signal and a clock signal. For example, an output signal from a camera is supplied as the pair of differential signals N1 and P1 and a clock signal is supplied as the one pair of differential clock signals NC and PC.

The processing circuit portion not shown retrieves the pair of output signals ON1 and OP1 in synchronization with the pair of differential output clock signals ONC and OPC, performs processing thereon, and supplies the pair of processed differential output signals ON1 and OP1 to the microprocessor CPU. The description has been given heretofore using the unit circuit CSI-U1 corresponding to the second lane as an example, but the same applies also to the unit circuit CSI-U0 corresponding to the first lane.

The pair of differential signals N0 and P0 as first-lane input signals are supplied from outside the semiconductor device SIP (e.g., camera not shown) to corresponding bump electrodes BD-N0 and BD-P0 via the signal lines in the wiring substrate SIP-B. Likewise, the pair of differential signals N1 and P1 as second-lane input signals are also supplied from outside the semiconductor device SIP to the corresponding bump electrodes BD-N1 and BD-P1 via the signal lines in the wiring substrate SIP-B. The pair of differential clock signals NC and PC as the clock signal are also supplied from outside the semiconductor device SIP to corresponding bump electrodes BD-NC and BD-PC via the signal lines in the wiring substrate SIP-B.

With the respective differential circuits SA in the unit circuit portions CSI-U0, CSI-U1, and CSI-UC, bump electrodes BD-Va, BD-Vs, and BD-RE are connected. The bump electrode BD-Va is an analog-power-supply bump electrode (analog-power-supply terminal) to which an analog power supply voltage Va is supplied and receives the analog power supply voltage Va supplied thereto from outside the semiconductor device SIP. The bump electrode BD-Vs is a ground-power-supply bump electrode (ground-power-supply terminal) to which a ground power supply voltage Vs is supplied. To the bump electrode BD-Vs, the ground power supply voltage Vs is supplied from outside the semiconductor device SIP. The differential circuit SA in each of the unit circuit portions CSI-U0, CSI-U1, and CSI-UC operates using the analog power supply voltage Va supplied to the analog-power-supply bump electrode BD-Va as an operating voltage. Each of the differential circuits SA has a characteristic thereof set on the basis of the reference signal REXT supplied to the bump electrode BD-RE.

Each of the level conversion circuits LVCT in the unit circuit portions CSI-U0, CSI-U1, and CSI-UC is connected with a bump electrode BD-Vd and the bump electrode BD-Vs. Here, the bump electrode BD-Vd is a digital power supply bump electrode to which a digital power supply voltage Vd is supplied from outside the semiconductor device SIP. Each of the level conversion circuits LVCT operates using the digital power supply voltage Vd supplied to the digital-power-supply bump electrode BD-Vd as an operating voltage. In the example shown in FIG. 6, the level conversion circuit LVCT and the differential circuit SA are connected with the same bump electrode BD-Vs. However, the voltages supplied to the level conversion circuit LVCT and the differential circuit SA are not limited thereto. For example, it may also be possible to supply a digital ground power supply voltage to the level conversion circuit LVCT and supply an analog ground power supply voltage to the differential circuits SA.

Figure 8A:
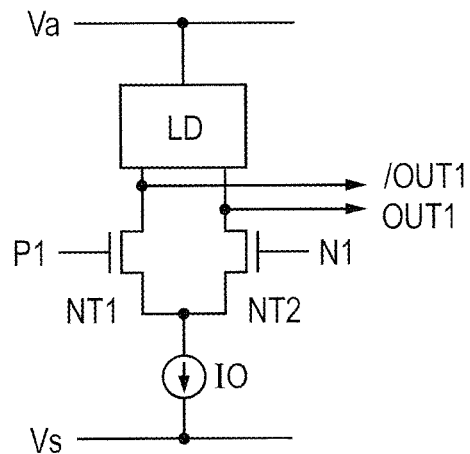
FIGS. 8A to 8C are views each showing a configuration of a circuit block in the semiconductor chip according to the embodiment.
Figure 8B:
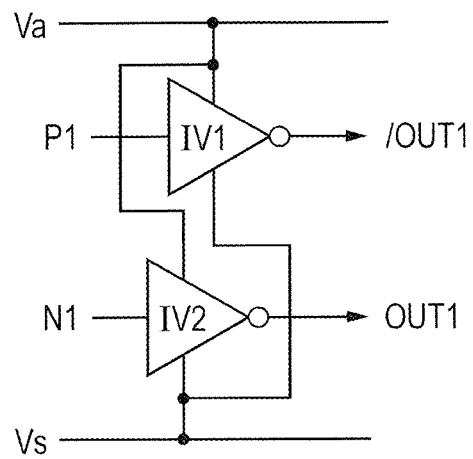

FIGS. 8A and 8B are circuit diagrams each showing an example of a configuration of the differential circuit SA.

As shown in, e.g., FIG. 8A, the differential circuit SA includes a pair of differential transistors (MOSFETs) NT1 and NT2, a constant current circuit IO, and a load circuit LD. The ground power supply voltage Vs is supplied to the sources of the differential transistors NT1 and NT2 via the constant current circuit IC, while the analog power supply voltage Va is supplied to the respective drains of the differential transistors NT1 and NT2 via the load circuit LD. As a result, signals /OUT1 and OUT1 corresponding to the difference between the pair of signals P1 and N1 are produced and output. As another example of the differential circuit SA, there is a pseudo differential circuit. An example of a configuration of the pseudo differential circuit is shown in FIG. 8B. The pseudo differential circuit includes a pair of inverter circuits IV1 and IV2 which are respectively supplied with the ground power supply voltage Vs and the analog power supply voltage Va to operate with the analog power supply voltage Va. By supplying the pair of differential signals P1 and N1 to the inverters IV1 and IV2, the differentially changing output signals/OUT1 and OUT1 are formed and output.

By using the pair of differential signals as an interface circuit, data can be determined on the basis of the difference between the signals. This allows a high-speed interface circuit to be implemented. That is, the interface circuit used in the embodiment is the high-speed interface circuit capable of high-speed data transfer.

Figure 8C:
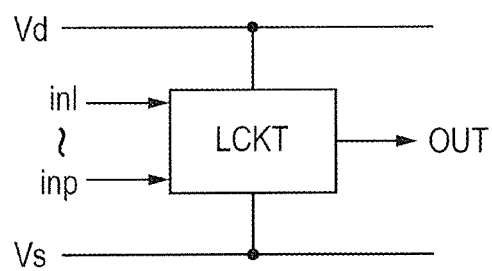

The microprocessor CPU shown in FIG. 5 includes logic circuits such as a NAND circuit and an OR circuit, a PLL oscillation circuit, and the like. These circuits operate with the digital power supply voltage Vd. Using the logic circuit shown in FIG. 8C as an example, a description will be given below. To a logic circuit LCKT, the ground power supply voltage Vs and the digital power supply voltage Vd are supplied. The logic circuit LCKT operates using the digital power supply voltage Vd as an operating voltage. In the description given using the example shown in FIG. 8C, the logic circuit LCKT performs a logic operation between single-phase input signals in1 to inp and outputs the result of the logic operation as OUT. The analog power supply voltage Va is supplied via the bump electrode VD-Va shown in FIG. 6, while the digital power supply voltage Vd is supplied via the bump electrode BD-Vd shown in FIG. 6.

In the present specification, the power supply voltage for operating the differential circuits and the PLL oscillation circuit is referred to as the analog power supply voltage and the power supply voltage for operating the logic circuits is referred to as the digital power supply voltage.

FIG. 7 shows an arrangement of the bump electrodes BD-Vd, BD-Vs, BD-Va, BD-N0, BD-P0, BD-N1, BD-P1, BD-NC, and BD-PC illustrated in FIG. 6. FIG. 7 shows an arrangement of the bump electrodes arranged over the second main surface SAFC2 of the semiconductor chip CH when the second main surface SAFC2 is viewed from the first main surface SAFC1. In FIG. 6, each of the analog-power-supply bump electrode BD-Va, the digital-power-supply bump electrode BD-Vd, and the ground-power-supply bump electrode BD-Vs is shown as one bump electrode. However, in this embodiment, each of the power-supply bump electrodes mentioned above includes a plurality of bump electrodes. FIG. 7 illustrates the arrangement of the bump electrodes shown in FIG. 6 in accordance with the real arrangement thereof.

The bump electrodes in the interface circuit CSI shown in FIG. 6 are arranged in one terminal region CSI-BD of the second main surface SAFC2 of the semiconductor chip CH. The terminal region CSI-BD is shown by the broken line in FIG. 7 and includes sides (region sides) CS-U and CS-D extending in parallel with each other and sides (region sides) CS-R and CS-L intersecting the sides CS-U and CS-D. The sides CS-R and CS-L also extend in parallel with each other. Accordingly, the terminal regions CSI-BD is the region enclosed by the sides CS-U, CS-D, CS-R, and CS-L and has a quadrangular shape in plan view.

In FIG. 7, each of the bump electrodes is shown by the circular mark. As shown in "Explanatory Note" in FIG. 7, the function of each of the bump electrodes shown by the circular mark is shown by the lines or dots added to the circular marks. That is, the circular mark hatched with the thick horizontal solid lines shows each of the digital-power-supply bump electrodes. The circular mark hatched with the horizontal solid lines shows each of the analog-power-supply bump electrodes. The circular mark hatched with the vertical solid lines shows each of the ground-power-supply bump electrodes. The circular mark hatched with the rightwardly upward broken lines shows each of the signal bump electrodes. The circular mark with the solid core shows each of the clock-signal bump electrodes. The circular mark hatched with the dots shows the reference-signal bump electrode. The notation (see "Explanatory Note") shown in FIG. 17 also holds true in FIGS. 6, 9, 12, and 13 unless particularly explicitly described otherwise. In FIGS. 10, 11, 13, and 14, the external terminals arranged over the wiring substrate SIP-B are also denoted in accordance with the notation shown in FIG. 7.

The interface circuit CIS shown in FIG. 6 is formed so as to overlap the terminal region CSI-BD shown in FIG. 7, though the formation of the interface circuit CSI is not particularly limited. That is, the interface circuit CSI is formed to overlap a region located over the terminal region CSI-BD placed in the second main surface SAFC2 (closer to the first main surface SAFC1) when viewed from the first main surface SAFC1.

In the terminal region CSI-BD, the bump electrodes are arranged in a zigzag pattern. Among the bump electrodes arranged in the zigzag pattern, the plurality of digital-power-supply bump electrodes BD-Vd are arranged close to and along the side CS-U of the terminal region CSI-BD. In other words, the plurality of digital-power-supply bump electrodes BD-Vd are arranged close to and along the side CS-U to form a digital-power-supply bump electrode row BD-Vd.

Also, along the side CS-U, the plurality of ground-power-supply bump electrodes BD-Vs are arranged to form a ground-power-supply bump electrode row BD-Vs. Between the ground-power-supply bump electrode row BD-Vs and the side CS-U, the digital-power-supply bump electrode row BD-Vd is interposed. That is, in the embodiment, the ground-power-supply bump electrode row BD-Vs is arranged more distant from the side CS-U than the digital-power-supply bump electrode row BD-Vd.

Along the side CS-U, the ground-power-supply bump electrodes BD-Vs and the analog-power-supply bump electrodes BD-Va are alternately arranged. These bump electrodes form a bump electrode row BD-Vs:Va. Also, along the side CS-U, the analog-power-supply bump electrodes BD-Va and the ground-power-supply bump electrodes BD-Vs are alternately arranged. These bump electrodes form a bump electrode row BD-Va:Vs.

Also, along the side CS-U, the reference-signal bump electrode BD-RE to which the reference signal REXT is supplied, the signal bump electrode BD-P1 to which the differential signal P1 is supplied, the clock-signal bump electrode BD-PC to which the clock signal PC is supplied, and the signal bump electrode BD-P0 to which the differential signal P0 is supplied are arranged. These bump electrodes form a bump electrode BD-RE:P row. Also, along the side CS-U, the signal bump electrode BD-N1 to which the differential signal N1 is supplied, the clock-signal bump electrode BD-NC to which the clock signal NC is supplied, and the signal bump electrode BD-N0 to which the differential signal N0 is supplied are arranged. These bump electrodes form a bump electrode row BD-N. As can be seen from FIG. 7, in the terminal region CSI-BD, the bump electrode row BD-Vs:Va, the bump electrode row BD-Va:

Vs, the bump electrode row BD-RE:P, and the bump electrode row PD-N are in the order of increasing distance from the side CS-U.

Also, in the terminal region CSI-BD, close to and along the side CS-L, the digital-power-supply bump electrode Bd-Vd, the ground-power-supply bump electrode BD-Vs, and the reference-signal bump electrode BD-RE are arranged. These bump electrodes form a reference-signal bump electrode column BD-RE. Likewise, the three bump electrodes arranged along the side CS-L form a bump electrode column BD. In FIG. 7, the six bump electrode columns BD are included.

When the terminal region CSI-BD is viewed in terms of the bump electrode rows, the terminal region CSI-BD includes the six bump electrode rows. The row closest to the side CS-U is the digital-power-supply bump electrode row Bd-Vd. The row next closest to the side CS-U is the ground-power-supply bump electrode row BD-Vs. When the terminal region CSI-BD is viewed in terms of the bump electrode columns, the terminal region CSI-BD includes the six bump electrode columns. The column closest to the side CS-L is the reference-signal bump electrode column BD-RE.

Thus, the terminal region CSI-BD has an arrangement pattern in which the digital-power-supply bump electrode row BD-Vd and the ground-power-supply bump electrode row Vs are arranged close to the side CS-U and the reference-signal bump electrode column BD-RE including the reference-signal bump electrode BD-RE is arranged close to the side CS-L.

The interface circuit CSI shown in FIG. 6 is configured using a hard macro and, from the bump electrodes arranged in the terminal region CSI-BD shown in FIG. 7, the digital power supply voltage Vd, the ground power supply voltage Vs, the analog power supply voltage Va, the two pairs of differential signals, the one pair of differential clock signals, and the reference signal are supplied.

In this embodiment, the circuit configuration of the interface circuit CSI shown in FIGS. 6 and 7 and the arrangement pattern in the terminal region CSI-B are used as a reference. For example, when two lanes are added to the reference interface circuit CSI shown in FIGS. 6 and 7, two unit circuit portions each having the same configuration as that of the unit circuit portion CSI-U1 are added. In this case, the four bump electrode columns BD which are among the bump electrode columns BD shown in FIG. 7 and which do not include the clock-signal bump electrodes BD-PC and BD-NC are added to be connected with the two added unit circuit portions.

Conversely, when the lanes are reduced from the reference interface circuit CSI shown in FIGS. 6 and 7, e.g., the unit circuit portion CSI-U1 shown in FIG. 6 may be removed appropriately and the two bump electrode columns BD which are among the bump electrode columns BD shown in FIG. 7 and which do not include the clock-signal bump electrodes BD-PC and BD-NC may be removed appropriately. Needless to say, it may also be possible not to supply the differential signals to the signal bump electrodes without removing the unit circuit portion and the bump electrode columns.

In the embodiment, even when the number of lanes is increased or reduced, an arrangement pattern such that the digital-power-supply bump electrode row BD-Vd and the ground-power-supply bump electrode row Vs are arranged close to the side CS-U is maintained. Also, an arrangement pattern such that the reference-signal bump electrode column BD-RE including the reference-signal bump electrode BD-RE is arranged close to the side CS-L is maintained.

The description has been given of the rows and columns with reference to FIG. 7 but, needless to say, the rows may be the columns and the columns may be the rows depending on the direction of viewing.

<Arrangement of Bump Electrodes (Terminals) for High-Speed Interface Circuits>

Figure 9:
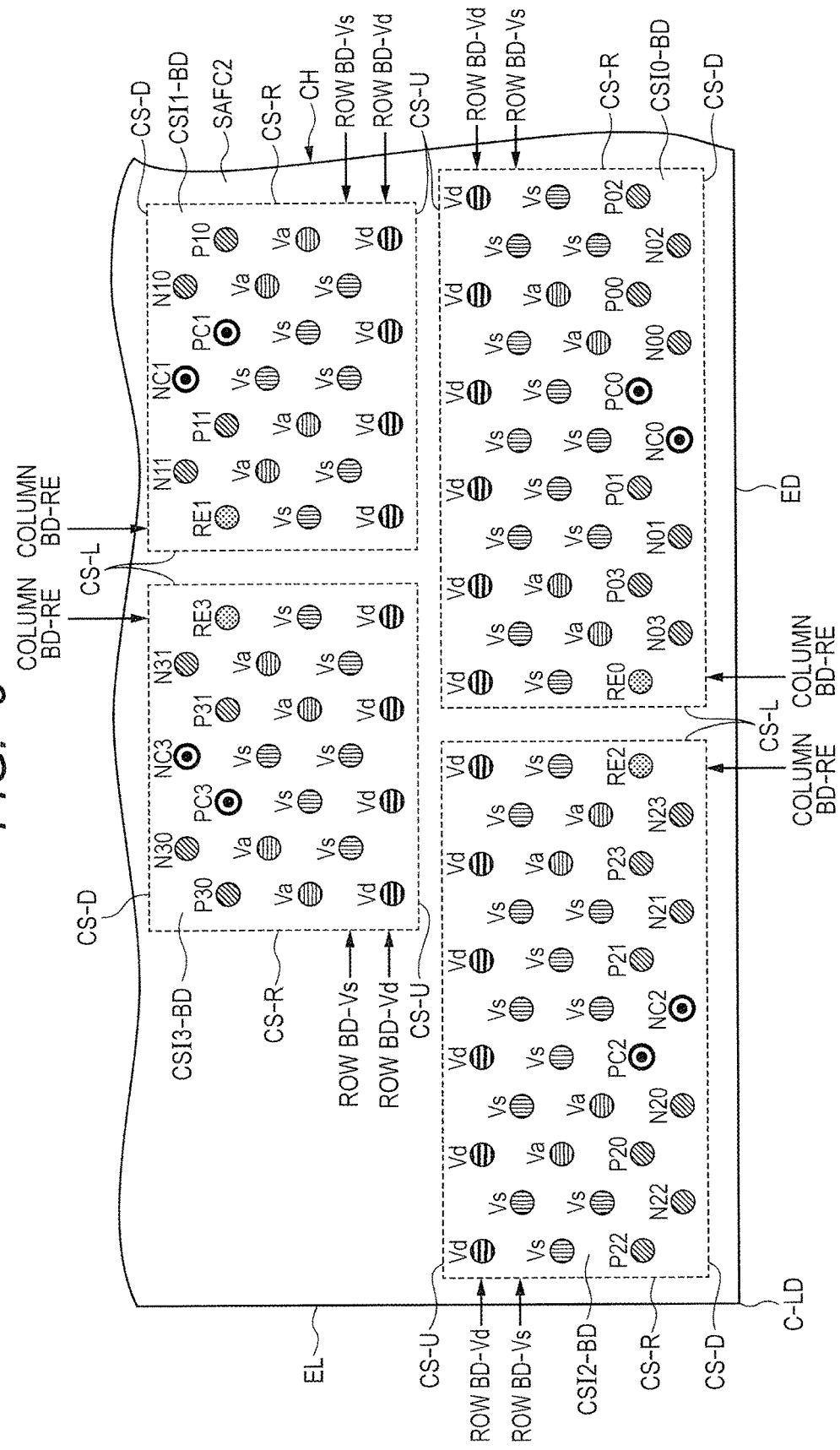
FIG. 9 is a plan view showing an arrangement of bump electrodes in the MIPI-CSI standardized interface circuits according to the embodiment.

FIG. 9 is a plan view showing an arrangement of bump electrodes connected with the MIPI-CSI standardized interface circuits CSI0 to CSI3 illustrated in FIG. 5. FIG. 9 is a plan view when the second main surface SAFC2 is viewed from the first main surface SAFC1 of the semiconductor chip CH. In the drawing, among the plurality of bump electrodes arranged over the second main surface SAFC2, only the bump electrodes connected with the interface circuits CSI0 to CSI3, i.e., the corresponding bump electrodes are shown.

In FIG. 9, a broken-line region CSI0-BD is a terminal region where the bump electrodes corresponding to the interface circuit CSI0 are arranged, and a broken-line region CSI1-BD is a terminal region where the bump electrodes corresponding to the interface circuit CSI1 are arranged. Likewise, a broken-line region CSI2-BD is a terminal region where the bump electrodes corresponding to the interface circuit CSI2 are arranged, and a broken-line region CSI3-BD is a terminal region where the bump electrodes corresponding to the interface circuit CSI3 are arranged.

In this embodiment, each of the interface circuits CSI0 and CSI2 has four lanes and each of the interface circuits CSI1 and CSI3 has two lanes, though the numbers of the lanes thereof are not particularly limited. As a result, each of the interface circuits CSI0 and CSI2 includes the one unit circuit portion CSI-UC corresponding to differential clock signals and the four unit circuit portions CSI-U0 to CSI-U3 corresponding to CSI input signals. Also, each of the interface circuits CSI1 and CSI3 includes the one unit circuit portion CSI-UC corresponding to the differential clock signals and the two unit circuit portions CSI-U0 and CSIU1 corresponding to the CSI input signals. Since each of the unit circuit portions CSI-UC and CSI-U0 to CSI-U3 mentioned herein is the same as the unit circuit portion CSI-U1 illustrated in FIG. 6, a description thereof is omitted.

In the terminal region CSI0-BD, the bump electrodes corresponding to the four lanes are arranged. To the terminal region CSI-BD illustrated in FIG. 7 and used as the reference, bump electrodes corresponding to two lanes have been added.

In FIG. 7, each of the reference marks and numerals of the power supply voltages and the signals begins with "BD-". However, in FIG. 9, to avoid complicated illustration, "BD-" is omitted from the reference marks. That is, in FIG. 9, each of the digital-power-supply bump electrodes is denoted by Vd, each of the ground-power-supply bump electrodes is denoted by Vs, and each of the analog-power-supply bump electrodes is denoted by Va.

On the other hand, the reference-signal bump electrode corresponding to the interface circuit CSI0 is denoted by RE0 and the reference-signal bump electrode corresponding to the interface circuit CSI1 is denoted by RE1. Also, the reference-signal bump electrode corresponding to the interface circuit CSI2 is denoted by RE2 and the reference-signal bump electrode corresponding to the interface circuit CSI3 is denoted by RE3. In this embodiment, to allow the characteristics of the differential circuits SA to be individually set in the respective interface circuits, the reference-signal bump electrode is arranged in one-to-one correspondence to each of the interface circuits.

In the terminal region CSI0-BD, N00, P00 to N03, and P03 denote signal bump electrodes to which input signals to the lanes are supplied and respective pairs of differential signals are supplied thereto. On the other hand, NC0 and PC0 denote clock-signal bump electrodes and a pair of differential clock signals are supplied thereto. In comparison with FIG. 7, FIG. 9 has the signal bump electrodes N02, P02, N03, and P03 added thereto. As a result of the addition of these bump electrodes, bump electrode columns DB including these bump electrodes have been added. The added bump electrode columns BD include not only the signal bump electrodes, but also the digital-power-supply bump electrodes Vd, the ground-power-supply bump electrodes Vs, and the analog-power-supply bump electrodes Va.

The number of the bump electrodes arranged in the terminal region CSI0-BD is larger than that in the reference terminal region CSI-BD, but the digital-power-supply bump electrode row Vd arranged along the side CS-U includes the digital-power-supply bump electrodes Vd. Likewise, the around-power-supply bump electrode row BD-Vs arranged along the side CS-U includes the ground-power-supply bump electrodes Vs. Also, the reference signal bump column BD-RE arranged along the side CS-L includes the reference-signal bump electrode RE0.

The terminal region CSI1-BD has an arrangement obtained by vertically mirror-inverting the reference terminal region CSI-BD (FIG. 7) relative to the side CS-U thereof. In the terminal region CSI1-BD also, N10, P10 to N11, and P11 denote the signal bump electrodes to which input signals to lanes are supplied and respective pairs of differential signals are supplied thereto. On the other hand, NC1 and PC1 denote clock-signal bump electrodes and a pair of differential clock signals are supplied thereto.

Since the reference terminal region CSI-BD has been mirror-inverted relative to the side CS-U, the side CS-U of the terminal region CSI1-BD is consequently close to the side CS-U of the terminal region CSI0-BD. In other words, the terminal region CSI1-BD is located such that the side CS-D of the terminal region CSI1-BD is further away from the side CS-U of the terminal region CSI0-BD. Since the side CS-U of the terminal region CSI1-BD is close to the side CS-U of the terminal region CSI0-BD, the digital-power-supply bump electrode row BD-Vd arranged close to the side CS-U of the terminal CSI1-BD is consequently close to the digital-power-supply bump electrode row BD-Vd arranged close to the side CS-U of the terminal region CSI0-BD. Likewise, the ground-power-supply bump electrode row BD-Vs arranged close to the side CS-U of the terminal region CSI1-BD is consequently close to the ground-power-supply bump electrode row BD-Vs arranged close to the side CS-U of the terminal region CSI0-BD.

Also, since the reference terminal region CSI-BD has been vertically mirror-inverted relative to the side CS-U, each of the side CS-L of the terminal region CSI0-BD and the side CS-L of the terminal region CSI1-BD faces the side EL of the semiconductor chip CH. That is, each of the reference-signal bump electrode column BD-RE arranged along the side CS-L of the terminal region CSI0-BD and the reference-signal bump electrode column BD-RE arranged along the side CS-L of the terminal region CSI1-BD faces the side EL of the semiconductor chip CH.

The terminal region CSI2-BD has an arrangement obtained by laterally mirror-inverting the reference terminal region CSI-BD (FIG. 7) relative to the side CS-L thereof. In addition, the number of the lanes is changed from 2 to 4. From another perspective, the terminal region CSI2-BD can also be regarded as a region obtained by laterally mirror-inverting the terminal region CSI0-BD relative to the side CS-L.

In the terminal region CSI2-BD also, N20, P20 to N23, and P23 denote signal bump electrodes to which input signals to lanes are supplied and respective pairs of differential signals are supplied. On the other hand, NC2 and PC2 are clock-signal bump electrodes and a pair of differential clock signals are supplied thereto.

Since the reference terminal region CSI-BD has been mirror-inverted relative to the side CS-L, the side CS-L of the terminal region CSI2-BD is consequently close to the side CS-L of the terminal region CSI0. In other words, the terminal region CSI2-BD is located such that the side CS-R of the terminal region CSI2-BD is further away from the side CS-L of the terminal region CSI0-BD. Since the side CS-L of the terminal region CSI2-BD is close to the side CS-L of the terminal region CSI0-BD, the reference-signal bump electrode column BD-RE arranged close to the side CS-L of the terminal region CSI2-BD is consequently close to the reference-signal bump electrode column BD-RE arranged close to the side CS-L of the terminal region CSI0-BD. That is, the reference-signal bump electrode BD-RE0 arranged close to the side CS-L of the terminal region CSI0-BD is close to the reference-signal bump electrode BD-RE2 arranged close to the side CS-L of the terminal region CSI2-BD.

The terminal region CSI3-BD has an arrangement obtained by vertically mirror-inverting the reference terminal CSI-BD (FIG. 7) relative to the side CS-U thereof and further laterally mirror-inverting the resulting arrangement relative to the side CS-L. From another perspective, the terminal region CSI3-BD can also be regarded as a region obtained by laterally mirror-inverting the terminal region CSI1-BD relative to the side CS-L.

In the terminal region CSI3-BD also, N30, P30, N31, and P31 denote signal bump electrodes to which input signals to lanes are supplied and respective pairs of differential signals are supplied thereto. On the other hand, NC3 and PC3 denote clock-signal bump electrodes and a pair of differential clock signals are supplied thereto.

Since the reference terminal region CSI-BD has been mirror-inverted relative to the side CS-L, the side CS-L of the terminal region CSI3-BD is consequently close to the side CS-L of the terminal region CSI1-BD. In other words, the terminal region CSI3-BD is located such that the side CS-R of the terminal region CSI3-BD is further away from the side CS-L of the terminal region CSI1-BD. Since the reference terminal CSI-BD has also been mirror-inverted relative to the side CS-U, the side CS-U of the terminal region CSI3-BD is consequently close to the side CS-U of each of the terminal regions CSI0-BD and CSI2-BD.

As a result, the digital-power-supply bump electrode row BD-Vd and the ground-power-supply bump electrode row BD-Vs in the terminal region CSI3-BD are close to the digital-power-supply bump electrode row BD-Vd and the ground-power-supply bump electrode row BD-Vs in each of the terminal regions CSI0-BD and CSI2-BD. In addition, the reference-signal bump electrode column BD-RE arranged close to the side CS-L of the terminal region CSI3-BD is close to the reference-signal bump electrode column BD-RE arranged close to the side CS-L of the terminal region CSI1-BD. That is, the reference-signal bump electrode BD-RE1 arranged close to the side CS-L of the terminal region CSI1-BD is close to the reference-signal bump electrode BD-RE3 arranged close to the side CS-L of the terminal region CSI3-BD.

As a result, over the second main surface SAFC2 of the semiconductor chip CH, the digital-power-supply bump electrode row BD-Vd and the ground-power-supply bump electrode row BD-Vs in each of the terminal regions CSI0-BD to CSI3-BD are close to each other. Also, over the second main surface SAFC2 of the semiconductor chip CH, the respective reference-signal bump electrode columns BD-RE in the terminal regions CSI0-BD to CSI3-BD are close to each other.

<Overall Layout of Wiring Substrate SIP-B>

Figure 10:
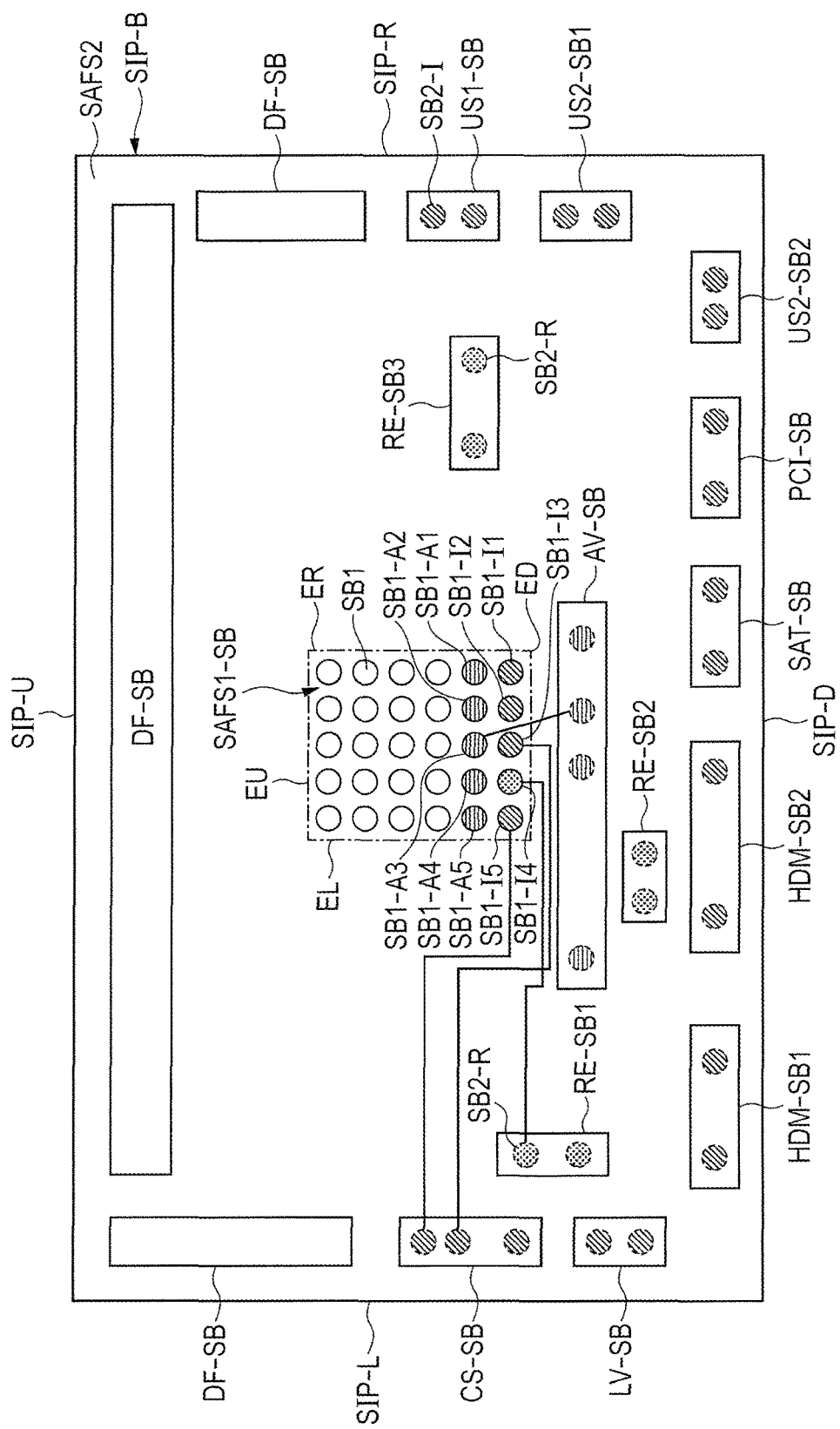
FIG. 10 is a plan view of the wiring substrate according to the embodiment.

FIG. 10 is a plan view of the wiring substrate SIP-B according to the embodiment. FIG. 10 is a plan view of the wiring substrate SIP-B when the wiring substrate SIP-B is viewed from the first main surface SAFS1.

In FIG. 10, SIP-U and SIP-D denote the sides of the wiring substrate SIP-B. The sides SIP-U and SIP-D extend in parallel with each other. Also, SIP-R and SIP-L denote the sides of the wiring substrate SIP-B. The sides SIP-R and SIP-L extend in parallel with each other and intersect the sides SIP-U and SIP-D. It can be considered that the first and second main surfaces SAFS1 and SAFS2 of the wiring substrate SIP-B are enclosed by these sides SIP-U, SIP-D, SIP-R, and SIP-L and have quadrangular shapes in plan view.

As described above, over the first and second main surfaces SAFS1 and SAFS2 of the wiring substrate SIP-B, first and second external terminals are respectively formed. In FIG. 10, among the first external terminals formed over the first main surface SAFS1, first external terminals SB1 connected with the bump electrodes formed over the second main surface SAFC2 (FIG. 4) of the semiconductor chip CH via bumps are shown by the solid-line circular marks. On the other hand, second external terminals SB2 arranged over the second main surface SAFS2 of the wiring substrate SIP-B are shown by the broken-line circular marks.

In FIG. 10, a region SAFS1-SB shown by the dot-dash line is a region of the first main surface SAFS1 of the wiring substrate SIP-B. The semiconductor chip CH is mounted over the wiring substrate SIP-B such that the first main surface SAFS1 faces the second main surface SAFC2 of the semiconductor chip CH in the region SAFS1-SB. At this time, the first external terminals (circular marks) formed in the region SAFS1-SB shown by the dot-dash line are electrically connected with the corresponding bump electrodes BD formed over the second main surface SAFC2 of the semiconductor chip CH via bumps. In other words, it can be considered that the region SAFS1-SB shows the position where the semiconductor chip CH is mounted over the first main surface SAFS1 of the wiring substrate SIP-B.

Note that the semiconductor chip CH is mounted such that, when the semiconductor chip CH is mounted, the side EU (FIG. 4) of the semiconductor chip CH faces the side SIP-U of the wiring substrate SIP-B and the side ED (FIG. 4) of the semiconductor chip CH faces the side SIP-D of the wiring substrate SIP-B. At this time, the semiconductor chip CH is also mounted such that the side ER (FIG. 4) of the semiconductor chip CH faces the side SIP-R of the wiring substrate SIP-B and the side EL (FIG. 4) of the semiconductor chip CH faces the side SIP-L of the wiring substrate SIP-B.

In the dot-dash-line region SAFS1-SB, the plurality of first external terminals SB1 are two-dimensionally (planarly) regularly arranged. In FIG. 10, the first external terminals arranged in the region SAFS1-SB are shown as the first external terminals SB1 shown by the hollow circular marks, first external terminals SB1-A1 to SB-A5 shown by the circular marks hatched with the parallel solid lines, and first external terminals SB1-I1 to SB1-I5 shown by the circular marks hatched with the rightwardly upward oblique lines or the dots. Here, the first external terminals SB1-A1 to SB1-A5 are analog-power-supply first external terminals, the first external terminals SB1-I1 to SB1-I3 and SB1-I5 are signal first external terminals, and the first external terminal SB1-I4 is a reference-signal first external terminal. The region SAFS1-SB includes the plurality of first external terminals SB1 but, in FIG. 10, one of the first external terminals is denoted by the reference numeral SB1 by way of example.

As has been illustrated in FIGS. 4 and 9, over the second main surface SAFC2 of the semiconductor chip CH, the bump electrodes corresponding to the high-speed interface circuits are arranged along the side ED of the second main surface SAFC2 of the semiconductor chip CH. That is, the signal bump electrodes of the high-speed interface circuits and the analog-power-supply bump electrodes are arranged close to and along the side ED. Also, as shown in FIG. 9, the signal bump electrodes are arranged closer to the side than the analog-power-supply bump electrodes, though the locations of these bump electrodes are not particularly limited.

Accordingly, the signal first external terminals SB1-I1 to SB1-I5 (including the reference-signal first external terminal) are arranged along the lower side ED of the region SAFS1-SB corresponding to the side ED of the semiconductor chip CH. Also, the analog-power-supply first external terminals SB1-A1 to SB1-A5 are arranged along the lower side ED of the region SAFS1-SB such that the signal first external terminals SB1-I1 to SB1-I5 are interposed therebetween. When the semiconductor chip CH is mounted over the wiring substrate SIP-B, the signal first external terminals SB1-I1 to SB1-I5 are connected with the signal bump electrodes arranged along the side ED of the semiconductor chip CH via bumps. Likewise, the analog-power-supply first external terminals SB1-A1 to SB1-A5 are connected with the analog-power-supply bump electrodes arranged along the side ED of the semiconductor chip CH via bumps. Also, some of the plurality of first external terminals SB1 shown by way of example are connected with the bump electrodes BD shown in FIG. 4. As a result, the digital power supply voltage Vd and the ground power supply voltage Vs are supplied to the bump electrodes BD in FIG. 4 via the first external terminals SB1.

Over the second main surface SAFS2 of the wiring substrate SIP-B, a plurality of second external terminals are two-dimensionally (planarly) arranged. The second external terminals shown in FIG. 7 have been categorized in terms of functions and enclosed in regions. In FIG. 10, DF-SB denotes a second external terminal region where the plurality of second external terminals corresponding to the digital signal interface circuits are arranged. Also, in FIG. 10, US1-SB, US2-SB1, US2-SB2, PCI-SB, SAT-SB, HDM-SB1, HDM-SB2, LV-SB, and CS-SB denote second external terminal regions where signal second external terminals for the high-speed interface circuits are arranged. In FIG. 10, the signal second external terminals for the high-speed interface circuits are shown by the broken-line circular marks hatched with the rightwardly upward oblique lines. FIG. 10 illustrates the two signal second external terminals SB2-I which are arranged in each of the second external terminal regions US1-SB, US2-SB1, US2-SB2, PCI-SB, SAT-SB, HDM-SB1, HDM-SB2 and LV-SB corresponding to the high-speed interface circuits so as to show that each of the second external terminal regions US1-SB, US2-SB1, US2-SB2, PCI-SB, SAT-SB, HDM-SB1, HDM-SB2, and LV-SB includes the plurality of second external terminals. In the second external terminal region CS-SB, the three signal second external terminals are shown by way of example. Needless to say, the number of the signal second external terminals included in each of the second external terminal regions varies depending on the types of the interface circuits.

The signal second external terminals (not shown) included in the second external terminal region DF-SB correspond to the bump electrodes arranged in the terminal region DF shown in FIG. 4. The respective second external terminals SB2-I arranged in the second external terminal regions US1-SB, US2-SB1, US2-SB2, PCI-SB, SAT-SB, HDM-SB1, HDM-SB2, LV-SB, and CS-SB correspond to the respective signal bump electrodes in the terminal regions AF-1 to AF-6 and AF7-0 to AF7-3 shown in FIG. 4. The respective signal second external terminals SB2-I in the second external terminal regions DF-SB, US1-SB, US2-SB1, US2-SB2, PCI-SB, SAT-SB, HDM-SB1, HDM-SB2, LV-SB, and CS-SB are electrically connected with the first external terminals arranged in the region SAFS1-SB via the signal lines in the wiring substrate SIP-B and connected with the corresponding bump electrodes via the first external terminals.

By way of example, FIG. 10 shows the electrical connection of the two second external terminals SB2-I arranged in the second external terminal region CS-SB with the first external terminals SB1-I3 and SB1-I5 via the signal lines. The first external terminals SB1-I3 and SB1-I5 are connected with the corresponding bump electrodes via bumps. Likewise, the second external terminals SB2-I arranged in each of the other second external terminal regions are also electrically connected with the signal first external terminals arranged in the region SAFS1-SB via appropriate signal lines placed in the wiring substrate SIP-B and connected with the corresponding bump electrodes.

The USE standardized interface circuit US2 shown in FIG. 5 has two channels, though the number of the channels of the USB standardized interface circuit US2 is not particularly limited. Also, for the sake of convenience of illustration, a case where the HDMI standardized interface circuit HDM also has two channels will be described herein.

Signals from the USE standardized interface circuit US1 shown in FIG. 5 are connected with the bump electrodes arranged in the terminal region AF1 shown in FIG. 4. The bump electrodes arranged in the terminal region AF1 are connected with the second external terminals SB2-I arranged in the second external terminal region USB1-SB. First- and second-channel signals from the USB standardized interface circuit USB2 are connected with the bump electrodes in the terminal region AF2 shown in FIG. 4. In the terminal region AF2, the first-channel signal is connected with the second external terminals SB2-I in the second external terminal region US2-SB1 via the first external terminal, while the second-channel signal is connected with the second external terminals SB2-I in the second external terminal region US2-SB2 via the first external terminals. Also, signals from the interface circuit PCI shown in FIG. 5 are connected with the bump electrodes in the terminal AF3 and further connected with the second external terminals SB2-I in the second external terminal region PCI-SB via the first external terminals. Also, signals from the interface circuit SAT are connected with the bump electrodes in the terminal region AF4 and further connected with the second external terminals SB2-I in the second external terminal region SAT-SB via the first external terminals.

Also, signals from the interface circuit HDM shown in FIG. 5 are connected with the bump electrodes in the terminal region AF. The first-channel signal is connected with the second external terminals SB2-I in the second external terminal region HDM-SB1 via the first external terminals, while the second-channel signal is connected with the second external terminals SB2-I in the second external terminal region HDM-SB2 via the first external terminal. Signals from the interface circuit LVDS shown in FIG. 5 are connected with the bump electrodes in the terminal region AF6 and further connected with the second external terminals SB2-I in the second external terminal region LV-SB via the first external terminals.

Signals from the interface circuit CSI0 shown in FIG. 5 are connected with the signal bump electrodes (signals N00, P00 to N03, and P03 in FIG. 9) in the terminal region AF7-0. The clock signals are connected with the clock-signal bump electrodes (NC0 and PC0) in the terminal region AF7-0. The reference signal is connected with the reference bump electrode (RE0) in the terminal region AF7-0. Also, signals from the interface circuit CSI1 are connected with the signal bump electrodes (N10, P10 to N11, and P11 in FIG. 9) in the terminal region AF7-1. The clock signals are connected with the clock-signal bump electrodes (NC1 and PC1) in the terminal region AF7-1. The reference signal is connected with the reference bump electrode (RE1) in the terminal region AF7-1.

Also, signals from the interface circuit CSI2 shown in FIG. 5 are connected with the signal bump electrodes (signals N20, P20 to N23, and P23 in FIG. 9) in the terminal region AF7-2. The clock signals are connected with the clock-signal bump electrodes (NC2 and PC2) in the terminal region AF7-2. The reference signal is connected with the reference bump electrodes (RE2) in the terminal region AF7-2. Also, signals from the interface circuit CSI3 are connected with the signal bump electrodes (signals N30, P30 to N31, and P31 in FIG. 9) in the terminal region AF7-3. The clock signals are connected with the clock-signal bump electrodes (NC3 and PC3) in the terminal region AF7-3. The reference signal is connected with the reference bump electrode (RE3) in the terminal region AF7-3.

The respective signal bump electrodes in the terminal regions AF7-0 to AF7-3 are connected with the second external terminals SB2-I arranged in the second external terminal region CS-SB via the first external terminals. Likewise, the respective clock-signal bump electrodes in the terminal regions AF7-0 to AF7-3 are connected with the second external terminals SB2-I arranged in the second external terminal region CS-SB via the first external terminals.

In the embodiment, along some of the sides SIP-D, SIP-R, and SIP-L of the wiring substrate SIP-B, the second external terminals SB2-I which output or receive signals from the high-speed interface circuits are arranged close to each of the sides. This allows a user to easily receive or transmit signals from the interface circuits from or to the semiconductor device SIP using the user substrate UR-B (FIG. 2). In particular, signals having high data transfer speeds can be transmitted or received to or from the high-speed interface circuits using relatively short wiring lines.

In FIG. 10, RE-SB1, RE-SB2, and RE-SB3 denote second external terminal regions where reference-signal second external terminals SB2-R to which a reference voltage or a reference signal is supplied from outside the semiconductor device SIP are arranged. In FIG. 10, the reference-signal second external terminals SB2-R are denoted by the broken-line circular marks hatched with the dots. The reference-signal second external terminals SB2-R are also electrically connected with the first external terminals in the first external terminal region SAFS1-SB via an appropriate metal wiring layer in the wiring substrate.

By way of example, FIG. 10 shows the connection of the first external terminal SB1-I4 in the first external terminal region SAFS1-SB with the second external terminal SB2-R in the second external terminal region RE-SB1. The first external terminal SB1-I4 shown in FIG. 10 is connected with, e.g., the reference-signal bump electrode RE2 shown in FIG. 9. The first external terminal SB1-I3 in the first external terminal region SAFS1-SB is connected with, e.g., the signal bump electrode N03 in FIG. 9. The first external terminal SB1-I5 in the first external terminal region SAFS1-SB is connected with, e.g., the signal bump electrode N23 in FIG. 9. This results in the reception of the reference signal supplied to the second external terminal SB2-R by the differential circuit SA and the setting of the characteristics of the differential circuit SA.

In FIG. 10, AV-SB denotes a second external terminal region including analog-power-supply second external terminals (SB2-A1 to SB2-A5) to each of which an analog power supply voltage for operating the high-speed interface circuits is supplied. In FIG. 10, the analog-power-supply second external terminals are shown by the broken-line circular marks hatched with the parallel solid lines. The analog-power-supply second external terminals are electrically connected with the first external terminals SB1-A1 to SB1-A5 in the region SAFS1-SB via appropriate power supply voltage lines in the wiring substrate SIP-B. By way of example, FIG. 10 shows the electrical connection of the analog-power-supply second external terminals with the analog-power-supply first external terminals SB1-A3 arranged in the region SAFS1-SB by the power supply voltage lines in the wiring substrate SIP-B. The other analog-power-supply second external terminals are also electrically connected with the analog-power-supply first external terminals SB1-A1 to SB1-A5 via the power supply voltage lines in the wiring substrate SIP-B.

By mounting the semiconductor chip CH over the region SAFS1-SB, the analog-power-supply first external terminals SB1-A1 to SB1-A5 are connected via the bumps with the analog-power-supply-voltage bump electrodes of the high-speed interface circuits in the semiconductor chip CH. In an example described with reference to FIG. 9, the analog-power-supply-voltage first external terminal SB1-A3 is connected with the analog-power-supply bump electrode BD-Va shown in FIG. 9. As a result, the analog power supply voltage Va is supplied to the second external terminals arranged in the second external terminal region AV-SB to be supplied to the interface circuits.

Thus, in the embodiment, the signal second external terminals from or to which the signals from the high-speed interface circuits are output or input and the analog-power-supply second external terminals to which the analog power supply voltage for operating the high-speed interface circuits is supplied are physically isolated from each other over the second main surface SAFS2 of the wiring substrate SIP-B. That is, the signal second external terminals for the high-speed interface circuits and the analog-power-supply-voltage second external terminals which supply the power supply voltage for operating the high-speed interface circuits are not arranged close to each other over as a set, but are arranged to be isolated from each other over the second main surface SAFS2 of the wiring substrate SIP-B.

<Detailed Layout of Wiring Substrate>

Figure 11:
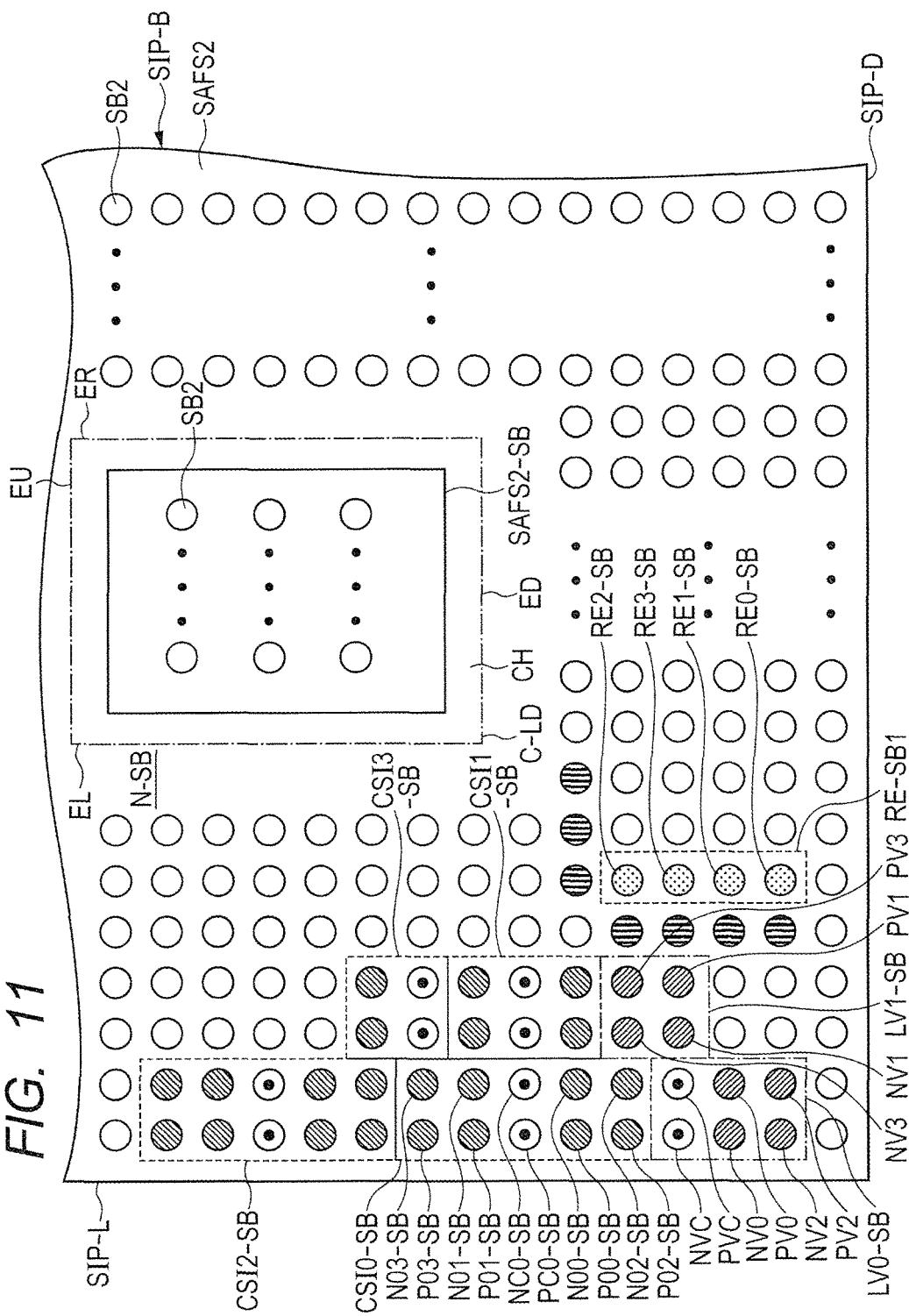
FIG. 11 is a detailed plan view of the wiring substrate according to the embodiment.

FIG. 11 is a plan view of the wiring substrate SIP-B according to the embodiment. FIG. 11 two-dimensionally shows the second main surface SAFS2 when the wiring substrate SIP-B is viewed from the first main surface SAFS1. That is, FIG. 11 is a plan view when the second main surface SAFS2 is viewed from the first main surface SAFS1 through the wiring substrate SIP-B.

Over the second main surface SAFS2 of the wiring substrate SIP-B, the plurality of second external terminals SB2 are two-dimensionally (planarly) formed to be arranged. In the embodiment, the second main surface SAFS2 is divided into three portions, though the number of portions into which the second main surface SAFS2 is divided is not particularly limited. That is, the second surface SAFS2 is divided into a center portion SAFS2-SB located at the center of the second main surface SAFS2, a vacant portion N-SB located so as to surround the center portion SAFS2-SB, and a second external terminal portion between the vacant portion N-SB and the sides SIP-U, SIP-D, SIP-R, and SIP-L.

The second external terminals SB2 arranged over the second main surface SAFS2 of the wiring substrate SIP-B are connected with the user first external terminals arranged over the first main surface SAFU1 of the user substrate UR-B, as illustrated in FIGS. 1 and 2. The second external terminals SB2 arranged over the center portion SAFS2-SB are used as the power-supply second external terminals to which, e.g., the digital power supply voltage Vd and the ground power supply voltage Vs are supplied. That is, when the second external terminals SB2 are connected with the user first external terminals over the user substrate UR-B, the digital power supply voltage Vd and the ground power supply voltage Vs are supplied from the user first external terminals to the second external terminals SB2 arranged over the center portion SAFS2-SB. The second external terminals arranged over the center portion SAFS2-SB are connected with the digital-power-supply first external terminals and the ground-power-supply first external terminals (hollow circular marks in FIG. 10) which are among the first external terminals arranged in the region SAFS1-SB and illustrated in FIG. 10 via any of the wiring layers in the wiring substrate SIP-B. Consequently, to the semiconductor chip CH, the digital power supply voltage and the ground power supply voltage are supplied also from the second external terminals arranged over the center portion SAFS2-SB.

Over the vacant portion N-SB arranged so as to surround the center portion SAFS2-SB, the second external terminals are not arranged. This eliminates the need to arrange the user first external terminals and the user second external terminals over the regions of the first and second main surfaces SAFU1 and SAFU2 of the user substrate UR-B which face the vacant portion N-SB when the wiring substrate SIP-B is mounted over the user substrate UR-B. As a result, it is possible to mount user components over the regions facing the vacant portions N-SB and improve the degree of freedom of the user.

Over the second external terminal portion between the vacant portion N-SB and the sides SIP-U, SIP-D, SIP-R, and SIP-L of the wiring substrate SIP-B, the plurality of second external terminals are two-dimensionally arranged. Among the plurality of second external terminals arranged over the second external terminal portion, the predetermined ones form the second external terminal regions DF-SB, US1-SB, US2-SB1, US2-SB2, PCI-SB, SAT-SB, HDM-SB1, HDM-SB2, LV-SB, CS-SB, AV-SB, and RE-SB1 to RE-SB3. The predetermined second external terminals SB2 arranged over the second external terminal portion are used as the second external terminals which supply the digital power supply voltage and the ground power supply voltage.

Note that, in FIG. 11, the dot-dash line shows the position of the semiconductor chip CH when the semiconductor chip CH is mounted over the wiring substrate SIP-B.

FIG. 11 shows the second external terminal portion located between the vacant portion N-SB and the sides SIP-D and SIP-L of the wiring substrate SIP-B in detail. That is, FIG. 11 shows the second external terminal regions LV-SB and C-SB illustrated in FIG. 10 in detail.

The second external terminal region CS-SB (FIG. 10) is divided into second external terminal regions CSI0-SB to CSI3-SB respectively corresponding to the MIPI-CSI standardized interfaces CSI0 to CSI3 in FIG. 11. In other words, the four second external terminal regions CSI0-SB to CSI3-SB respectively corresponding to the interface circuits CSI0 to CSI3 form the second external terminal region CS-SB shown in FIG. 10.

In FIG. 11, each of the second external terminal regions CSI0-SB to CSI3-SB is shown as a region enclosed by the broken line. In the embodiment, the second external terminal regions CSI0-SB to CSI3-SB are divided into two pairs and arranged in two zones using the side SIP-L of the wiring substrate SIP-B as a reference. That is, the second external terminal regions CSI0-SB and CSI2-SB are paired up and arranged to extend close to and along the side SIP-L of the wiring substrate SIP-B. On the other hand, the second external terminal regions CSI1-SB and CSI3-SB are paired up and arranged to extend along the side SIP-L of the wiring substrate SIP-B. The second external terminal regions CSI1-SB and CSI3-SB are arranged such that, between the second external terminal regions CSI1-SB and CSI3-SB and the side SIP-L, the second external terminal regions CSI0-SB and CSI2-SB are interposed. In other words, the second external terminal regions CSI0-SB and CSI2-SB are located so as to be closer to the side SIP-L than the second external terminal regions CSI1-SB and CSI3-SB. As a result, when the side SIP-L is used as the reference, the second external terminal regions CSI0-SB and CSI2-SB serve as the first-zone second external terminal regions and the second external terminal regions CSI1-SB and CSI3-SB serve as the second-zone external terminal regions.

Over the second external terminal region CSI0-SB, the signal second external terminals connected with the signal bump electrodes N00, P00 to N03, and P03 (FIG. 9) of the interface circuit CSI0 via signal lines each formed of any of the wiring layer in the wiring substrate SIP-B and the clock-signal second external terminals connected with the clock-signal bump electrodes NC0 and PC0 (FIG. 9) of the interface circuit CSI0 via signal lines each formed of any of the wiring layers in the wiring substrate SIP-B are arranged. On the other hand, over the second external terminal region CSI2-SB, the signal second external terminals connected with the signal bump electrodes N20, P20 to N23, and P23 (FIG. 9) of the interface circuit CSI2 via signal lines each formed of any of the wiring layers in the wiring substrate SIP-B and the clock-signal second external terminals connected with the clock-signal bump electrodes NC2 and PC2 (FIG. 9) of the interface circuit CSI2 via signal lines each formed of any of the wiring layers in the wiring substrate SIP-B are arranged.

Likewise, over the second external terminal region CSI1-SB, the signal second external terminals connected with the signal bump electrodes N10, P10 to N11, and P11 (FIG. 9) of the interface circuit CSI1 via signal lines each formed of any of the wiring layers in the wiring substrate SIP-B and the clock-signal second external terminals connected with the clock-signal bump electrodes NC1 and PC1 (FIG. 9) of the interface circuit CSI1 via signal lines each formed of any of the wiring layers in the wiring substrate SIP-B are arranged. On the other hand, over the second external terminal region CSI3-SB, the signal second external terminals connected with the signal bump electrodes N30 and P30 (FIG. 9) of the interface circuit CSI3 via signal lines each formed of any of the wiring layers in the wiring substrate SIP-B and the clock-signal second external terminals connected with the clock-signal bump electrodes NC3 and PC3 (FIG. 9) of the interface circuit CSI3 via signal lines each formed of any of the wiring layers in the wiring substrate SIP-B are arranged.

In FIG. 11, of the second external terminals arranged over the second external terminal regions CSI0-SB to CSI3-SB, those shown by the circular marks hatched with the rightwardly upward oblique lines are the second external terminals connected with the signal bump electrodes and those shown by the circular marks with the solid cores are the second external terminals connected with the clock-signal bump electrodes. In FIG. 11, to avoid complicated illustration, only the second external terminals arranged over the second external terminal region CSI0-SB which are connected with the bump electrodes of the interface circuit CSI0 are denoted by the reference numerals. Reference numerals are omitted from the other second external terminals arranged over the second external terminal regions CSI1-SB to CSI3-SB.

Next, using the second external terminal region CSI0-SB corresponding to the interface circuit CSI0 as an example, the arrangement of the second external terminals over the second external terminal region will be described. Over the second external terminal region CSI0-SB, the second external terminals SB2 are two-dimensionally arranged in five rows and two columns. In the middle portion (third row) of the second external terminal region CSI0-SB, the clock-signal second external terminals NC0-SB and PC0-SB are arranged. In FIG. 11, around the clock-signal second external terminals NC0-SB and PC0-SB, the signal second external terminals are arranged in the rows above and below the clock-signal second external terminals NC0-SB and PC0-SB.

The clock-signal second external terminals NC0-SB and PC0-SB arranged in the middle row are connected with the clock-signal bump electrodes NC0 and PC0 in the terminal region CSI0-BD shown in FIG. 9 via signal lines each formed of any of the wiring layers. In FIG. 11, the signal second external terminals N00-SB and P00-SB arranged in the row below the clock-signal second external terminals NC0-SB and PC0-SB are connected with the signal bump electrodes N00 and P00 in the terminal region CSI0-BD shown in FIG. 9 via signal lines in the wiring layer. The signal second external terminals N01-SB and P01-SB arranged in the row above the clock-signal second external terminals NC0-SB and PC0-SB are connected with the signal bump electrodes N01 and P01 in the terminal region CSI0-BD shown in FIG. 9 via signal lines in the wiring layer.

Likewise, the signal second external terminals N02-SB and P02-SB arranged in the row below the signal second external terminals N00-SB and P00-SB are connected with the signal bump electrodes N02 and P02 in the terminal region CSI0-BD shown in FIG. The signal second external terminals N03-SB and P03-SB arranged in the row above the signal second external terminals N01-SB and P01-SB are connected with the signal bump electrodes N03 and P03 in the terminal region CSI0-BD shown in FIG. 9.

In each of the second external terminal regions CSI1-SB and CSI2-SB also, the clock-signal second external terminals are arranged in the middle row and the signal second external terminals are arranged in the rows above and below the middle row. The clock-signal second external terminals arranged over each of the second external terminal regions CSI1-SB and CSI2-SB are connected with the clock-signal bump electrodes NC1, PC1, NC2, and PC2 in the corresponding terminal region CSI1-BD or CSI2-BD in FIG. 9. Also, the signal second external terminals arranged in the rows above and below the clock-signal second external terminals in each of the second external terminal regions CSI1-SB and CSI2-SB are connected with the signal bump electrodes in the corresponding terminal region CSI1-BD or CSI2-BD.

In the embodiment, the second external terminal region CSI3-SB uses only one lane. That is, the second external terminal region CSI3-SB includes only the pair of clock-signal second external terminals and the pair of signal second external terminals. The pair of clock-signal second external terminals arranged over the second external terminal region CSI3 are connected with the clock-signal bump electrodes NC3 and PC3 in the terminal region CSI3-BD shown in FIG. 9. The pair of signal second external terminals arranged over the second external terminal region CSI3 are connected with the signal bump electrodes N30 and P30 in the terminal region CSI3-BD shown in FIG. 9. Needless to say, it may also be possible to arrange the pair of signal second external terminals over the second external terminal region CSI3-SB and connect the pair of signal second external terminals with the bump electrodes N31 and P31 shown in FIG. 9 to provide two lanes.

In FIG. 11, the second external terminal region RE-SB1 enclosed by the broken line corresponds to the second external terminal region RE-SB1 shown in FIG. 10. In this embodiment, the reference signal which determines the respective characteristics of the MIPI-CSI standardized interface circuits CSI0 to CSI3 shown in FIG. 5 is supplied from the user substrate UR-B to the second external terminals arranged in the second external terminal region RE-SB1. In FIG. 11, the circular marks hatched with the dots show the second external terminals arranged over the second external terminal region RE-SB1 to clearly show that the second external terminals arranged over the second external terminal region RE-SB1 are reference-signal second external terminals.

In the embodiment, the reference-signal bump electrode RE0 (FIG. 9) connected with the differential circuit of the interface circuit CSI0 is connected with the reference-signal second external terminal RE0-SB arranged in the second external terminal region RE-SB1 via a signal line in any of the wiring layers. Also, the reference-signal bump electrode RE1 (FIG. 9) connected with the differential circuit of the interface circuit CSI1 is connected with the reference-signal second external terminal RE1-SB arranged in the second external terminal region RE-SB1 via a signal line in any of the wiring layers. The reference-signal bump electrode RE2 (FIG. 9) connected with the differential circuit of the interface circuit CSI2 is connected with the reference-signal second external terminal RE2-SB arranged in the second external terminal region RE-SB1 via a signal line in any of the wiring layers. Likewise, the reference-signal bump electrode RE3 (FIG. 9) connected with the differential circuit of the interface circuit CSI3 is connected with the reference-signal second external terminal RE3-SB arranged in the second external terminal region RE-SB1 via a signal line in any of the wiring layers.

In FIG. 11, LV0-SB and LV1-SB denote second external terminal regions to which signals and clock signals which are from the interface circuit LVDS shown in FIG. 5 are supplied. Similarly to the signals and the clock signals which are from the interface circuits CSI0 to CSI3, the signals and the clock signals which are from the interface circuit LVDS are also supplied to the predetermined bump electrodes arranged over the second main surface SAFC2 of the semiconductor chip CH. The signals and the clock signals supplied to the predetermined bump electrodes are supplied via the predetermined first external terminals over the wiring substrate SIP-B and the signal lines therein to the second external terminals arranged in the second external terminal regions LV0-SB and LV1-SB1. In FIG. 10, the second external terminal region LV-SB corresponding to the interface circuit LVDS is shown as one region. However, similarly to the second external terminal regions CS-BS corresponding to the interface circuits CSI0 to CSI3, the second external terminal LV-SB includes the second external terminal regions LV0-SB and LV1-SB in two zones.

In the second external terminal regions LV0-SB and LV1-SB, the circular marks hatched with the rightwardly downward oblique lines show the signal second external terminals NV0, PV0 to NV3, and PV3 to which the signals are supplied from the interface circuit LVDS (FIG. 5). The second external terminals shown by the circular marks with the solid cores are the clock-signal second external terminals NVC and PVC to which the clock signals are supplied from the interface circuit LVDS.

In the embodiment, the second external terminal region LV0-SB is arranged close to and along the side SIP-L. The second external terminal region LV1-SB is also arranged along the side SIP-L but, between the second external terminal region LV1-SB and the side SIP-L, a partial area of the second external terminal region LV0-SB and a partial area of the second external terminal region CSI0-SB are located so as to be interposed therebetween. That is, when the side SIP-L is used as a reference, the second external terminal region LV0-SB corresponds to the first zone and the second external terminal region LV1-SB corresponds to the second zone. In other words, the second external terminal region LV1-SB is arranged to be further away from the side SIP-L than the second external terminal region LV0-SB.

In FIG. 11, the clock-signal second external terminals NVC and PVC to which the differential pair of clock signals are supplied are arranged in the uppermost row in the second external terminal region LV0-SB arranged close to the side SIP-L. Below the clock-signal second external terminals NVC and PVC, the signal second external terminals NV0 and PV0 to which the pair of differential signals are supplied are arranged and the signal second external terminals NV2 and PV2 to which the pair of differential signals are supplied are arranged therebelow. In the second external terminal region LV1-SB arranged more distant from the side SIP-L than the second external terminal region LV0-SB, the signal second external terminals NV3 and PV3 to which the pair of differential signals are supplied are arranged in one row. In the row below the row of the signal second external terminals NV3 and PV3, the signal second external terminals NV1 and PV1 to which the pair of differential signals are supplied are arranged.

In FIG. 11, the circular marks hatched with the parallel vertical lines show examples of the ground-power-supply second external terminals to which the ground power supply voltage is supplied when the wiring substrate SIP-B is mounted over the user substrate UR-B. Also, in FIG. 11, by way of example, the plurality of hollow circular marks show the second external terminals arranged over the second main surface SAFS2 so as to show that the plurality of second external terminals are arranged over the second main surface SAFS2 of the wiring substrate SIP-B.

In the embodiment, when the side SIP-L of the wiring substrate SIP-B is used as the reference, the second external terminal regions CSI0-SB to CSI3-SB corresponding to the MIPI-CSI standardized interface circuits CSI0 to CSI3 are divided into two pairs and arranged in two zones. Likewise, the second external terminal regions corresponding to the LVDS technology interface circuits LVDS are also divided into the second external terminal regions LV0-SB and LV1-SB and arranged in two zones. It can be considered that the first-zone second external terminal regions (CSI0-SB, CSI2-SB, and LV0-SB) and the second-zone second external terminal regions (CSI1-SB, CSI3-SB, and LV1-SB) are arranged in this order in a direction from the side SIP-L toward the center portion of the wiring substrate SIP-B or the region thereof where the semiconductor chip CH is mounted (dot-dash line in FIG. 11). In other words, the first-zone second external terminal regions are arranged closer to the side SIP-L than the second-zone external terminal regions.

In the embodiment, as described with reference to FIG. 5, the interface circuits CSI0 to CSI3 are arranged close to the corner portion C-LD among the four corner portions of the semiconductor chip CH. Accordingly, the terminal regions CSI0-BD to CSI3-BD corresponding to the interface circuits CSI0 to CSI3 are also arranged close to the corner portion C-LD among the four corner portions.

In the case of viewing the semiconductor chip CH from the first main surface SAFC1 thereof when the semiconductor chip CH is mounted over the wiring substrate SIP-B, it can be considered to connect the signal lines in the wiring substrate SIP-B intersecting the side ED of the semiconductor chip CH with the signal bump electrodes, the clock-signal bump electrodes, and the reference-signal bump electrodes each arranged over the terminal regions CSI0-SB to CSI3-SB such that signals are transmitted from the second external terminal regions CSI0-SB to CSI3-SB to the signal lines intersecting the side ED. However, since the terminal regions CSI0-BD to CSI3-BD are arranged in two zones in a direction from the side ED toward the center of the semiconductor chip CH, the number of the signal lines intersecting the side ED may conceivably increase to result in difficulty in placing all the signal lines. For example, it can be considered to form the signal lines intersecting the side ED of mutually different wiring layers. However, in this case, signal quality may conceivably deteriorate due to a change in the layers of the wiring substrate SIP-B or the intersection of the signal lines.

In the embodiment, the terminal regions CSI0-BD to CSI3-BD arranged in two zones are arranged close to the corner portion C-LD. Accordingly, using, e.g., the signal lines intersecting the side ED, signals are supplied to the signal bump electrode, the clock-signal bump electrodes, and the reference-signal bump electrodes in the first-zone terminal regions CSI0-BD and CSI2-BD and, using the signal lines intersecting the side EL, signals are supplied to the signal bump electrodes, the clock-signal bump electrodes, and the reference-signal bump electrodes over the second-zone terminal regions CSI1-BD and CSI3-BD. This can reduce the number of the signal lines intersecting the side ED and thus improve signal quality. Needless to say, it may also be possible to supply the signals to be supplied to some of the signal bump electrodes, the clock-signal bump electrodes, and the reference-signal bump electrodes in the second-zone terminal regions CSI1-BD and CSI3-BD using the signal lines intersecting the side EL. By thus arranging the terminal regions arranged in two zones close to the corner portion, it is possible to improve the degree of freedom of the wiring lines in the wiring substrate SIP-B.

For the convenience of the user, the second external terminal regions corresponding to the interface circuits are preferably arranged along the sides SIP-U, SIP-D, and SIP-R of the wiring substrate SIP-B. On the other hand, as a result of an increase in the size of the wiring substrate SIP-B, the manufacturing cost of the wiring substrate SIP-B increases. In this embodiment, the second external terminal regions corresponding to the interface circuits CSI0 to CSI3 and LVDS are arranged in two zones in the wiring substrate SIP-B, which increases the number of the interface circuits. Consequently, even when the number of the second external terminal regions increases, it is possible to inhibit the sides of the wiring substrate SIP-B from being elongated and inhibit the size of the wiring substrate from increasing. This can inhibit the manufacturing cost of the wiring substrate from increasing.

Also, in this embodiment, in correspondence to the respective interface circuits CSI0 to CSI3, the second external terminal regions CSI0-SB to CSI3-SB are arranged in two zones along the side SIP-L of the wiring substrate SIP-B. Accordingly, using, e.g., the signal lines formed in the predetermined wiring layer of the user substrate UR-B, signals can be supplied to the respective lanes of the interface circuits CSI0 and CSI2 arranged close to the side SIP-L. At this time, the signals can be supplied to the respective lanes of the interface circuits CSI1 and CSI3 arranged away from the side SIP-L using signal lines formed using a wiring layer different from the predetermined wiring layer described above. This allows the user to handle the interface circuits as units and can improve convenience.

<Power Supply Lines in Wiring Substrate>

Figure 12:
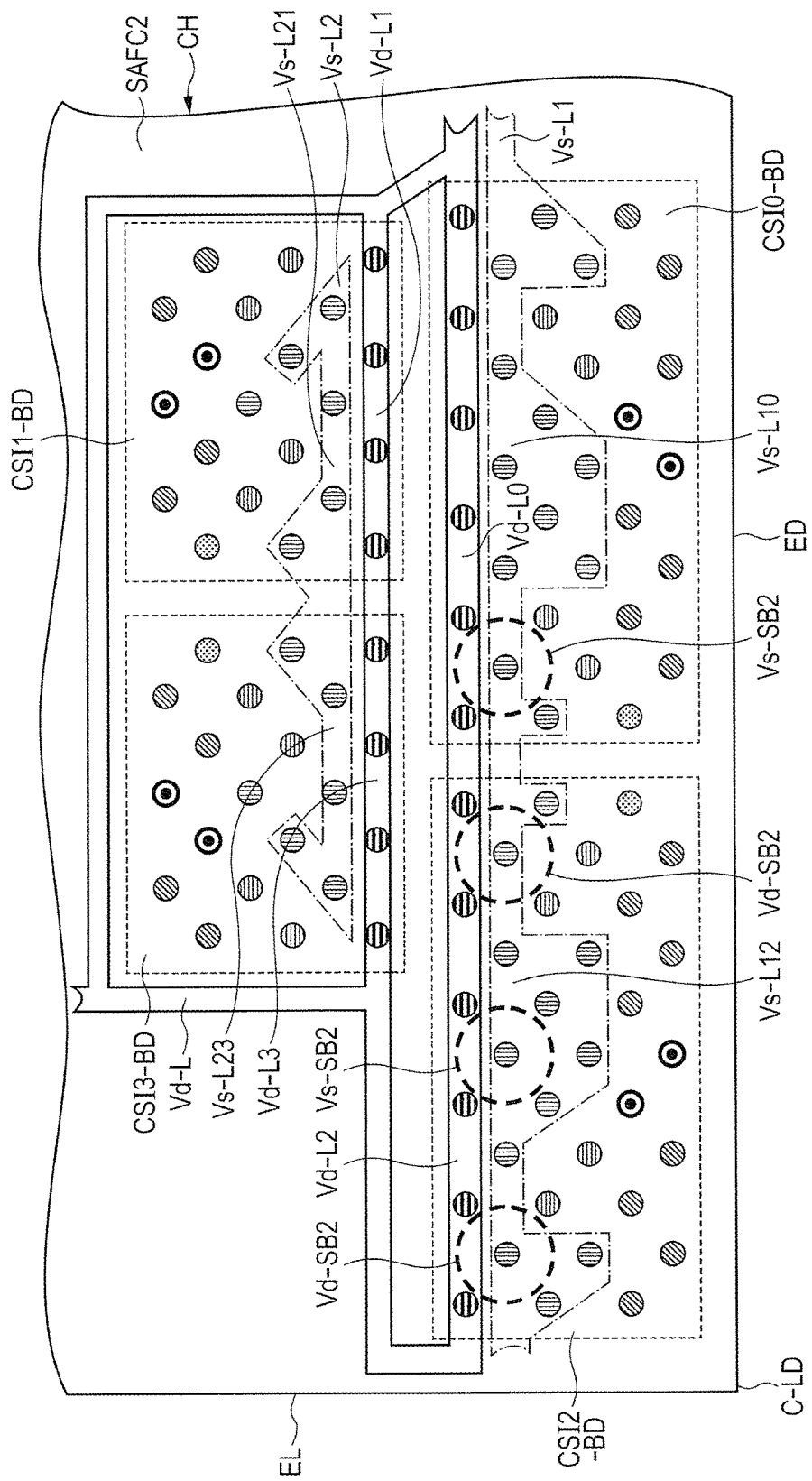
FIG. 12 is a plan view of a semiconductor device according to the embodiment.

FIG. 12 is a plan view of the semiconductor device SIP according to the embodiment. FIG. 12 is a plan view when the semiconductor device SIP in which the semiconductor chip CH is mounted over the wiring substrate SIP-B is viewed from the first main surface SAFC1 of the semiconductor chip CH. In the drawing, the bump electrodes arranged over the second main surface SAFC2 of the semiconductor chip CH and the digital-power-supply voltage lines and the ground-power-supply voltage lines in the wiring substrate SIP-B are illustrated.

FIG. 12 shows the arrangements of the bump electrodes over the terminal regions CSI0-BD to CSI3-BD. The arrangements of the bump electrodes shown in FIG. 12 are the same as the arrangements of the bump electrodes already illustrated in FIG. 9. Accordingly, a description related to the arrangements of the bump electrodes over the terminal regions CSI0-BD to CSI3-BD is omitted. Also, to avoid complicated illustration, the reference numerals shown in FIG. 9 are omitted in FIG. 12. Note that, in the same manner as in FIG. 9, in FIG. 12 also, a format in which the bump electrodes are denoted is based on the "Explanatory Note" illustrated in FIG 7.

In FIG. 12, a solid line Vd-L denotes the digital-power-supply voltage line formed of a predetermined conductive wiring layer in the wiring substrate SIP-B. Dot-dash lines Vs-L1 and Vs-L2 denote the ground-power-supply voltage lines formed of the predetermined conductive wiring layer in the wiring substrate SIP-B. The predetermined conductive wiring layer is, e.g., the first-layer metal wiring layer ML1 shown in FIG. 3.

When viewed from the first main surface SAFC1, the digital-power-supply voltage line Vd-L includes regions (power-supply-voltage-line regions) Vd-L0 to Vd-L3 overlapping the respective terminal regions CSI0-BD to CSI3-BD. Also, the ground-power-supply voltage line Vs-L1 includes regions (ground-power-supply-voltage-line regions) Vs-L10 and Vs-L12 overlapping the terminal regions CSI0-BD and CSI2-BD. Likewise, the ground-power-supply voltage line Vs-L2 includes regions (ground-power-supply-voltage-line regions) Vs-L21 and Vs-L23 overlapping the terminal regions CSI1-BD and CSI3-BD.

The digital-power-supply voltage line Vd-L is placed such that the digital-power-supply bump electrode rows Bd-Vd (FIG. 9) in the respective terminal regions CSI0-BD to CSI3-BD overlap the digital-power-supply-voltage-line regions Vd-L0 to Vd-L3 of the digital-power-supply voltage line Vd-L. Likewise, the ground-power-supply voltage lines Vs-L1 and Vs-L2 are placed such that the ground-power-supply bump electrode rows Bd-Vs (FIG. 9) in the respective terminal regions CSI0-BD to CSI3-BD overlap the ground-power-supply-voltage-line regions Vs-L10, Vs-L12, Vs-L21, and Vs-L23 of the ground-power-supply voltage lines Vs-L1 and Vs-L2.

When the semiconductor chip CH is mounted over the wiring substrate SIP-B, openings are provided in the predetermined portions of the top insulating film TIS (FIG. 3). The respective digital-power-supply bump electrodes Vd (FIG. 9) arranged in the digital-power-supply bump electrode rows VD-Vd are electrically connected with the digital-power-supply voltage line Vd-L in the power-supply-voltage-line regions Vd-L0 to Vd-L3. Also, the ground-power-supply bump electrodes Vs including the ground-power-supply bump electrodes Vs (FIG. 9) arranged in the ground-power-supply bump electrode row BD-Vs are electrically connected with the ground-power-supply voltage lines Vs-L1 and Vs-L2 in the ground-power-supply-voltage-line regions Vs-L10, Vs-L12, Vs-L21, and Vs-L23.

Although not illustrated in FIG. 12, the analog-power-supply bump electrodes, the signal bump electrodes, the reference-signal bump electrodes, and the clock-signal bump electrodes are also connected with signal lines formed of appropriate conductive wiring layers through the openings provided in the top insulating film TIS.

In FIG. 12, the large broken-line circular mark denoted by the reference numeral Vd-SB2 shows the digital-power-supply second external terminal Vd-SB2 arranged over the second main surface SAFS2 of the wiring substrate SIP-B. The broken-line large circular mark denoted by the reference numeral Vs-SB2 shows the ground-power-supply second external terminal Vs-SB2 arranged over the second main surface SAFS2 of the wiring substrate SIP-B. The digital-power-supply voltage line Vd-L formed of the first metal wiring layer ML1 is electrically connected with the digital-power-supply second external terminal Vd-SB2 arranged immediately under, e.g., the digital-power-supply voltage line Vd-L (regions Vd-L0 and Vd-L2) via through holes. Likewise, the ground-power-supply voltage lines Vs-L1 and Vs-L2 formed of the first metal wiring layer ML1 are electrically connected with, e.g., the ground-power-supply second external terminal Vs-SB2 arranged immediately under the ground-power-supply voltage line Vs-L (regions Vs-L10 and Vs-L12) via through holes.

In this embodiment, the digital-power-supply-voltage-line regions overlapping the terminal arrangements CSI1-BD and CSI3-BD are close to the terminal arrangements CSI0-BD and CSI2-BD. On the other hand, the digital-power-supply-voltage-line regions overlapping the terminal arrangements CSI0-BD and CSI2-BD are close to the terminal arrangements CSI1-BD and CSI3-BD. That is, the digital-power-supply voltage line which supplies the digital power supply voltage Vd for operating the interface circuits CSI0 and CSI2 and the digital-power-supply voltage line which supplies the digital power supply voltage Vd for operating the interface circuits CSI1 and CSI3 are placed close to each other in the wiring substrate SIP-B.

Likewise, the ground-power-supply-voltage-line regions overlapping the terminal arrangements CSI1-BD and CSI3-BD are close to the terminal arrangements CSI0-BD and CSI2-BD. On the other hand, the ground-power-supply-voltage-line regions overlapping the terminal arrangements CSI0-BD and CSI2-BD are close to the terminal arrangements CSI1-BD and CSI3-BD. That is, the ground-power-supply voltage line which supplies the ground voltage to the interface circuits CSI0 and CSI2 and the ground-power-supply voltage line which supplies the ground voltage to the interface circuits CSI1 and CSI3 are placed close to each other in the wiring substrate SIP-B.

As a result, it is possible to closely arrange the digital-power-supply second external terminals Vd-SB2 and the ground-power-supply second external terminals Vs-SB2 over the second main surface SAFS2 of the wiring substrate SIP-B. By closely arranging the digital-power-supply second external terminals Vd-SB2 and the ground-power-supply second external terminals Vs-SB2, when the semiconductor device SIP is mounted over the user substrate UR-B, it is possible to efficiently connect the second external terminals Vd-SB2 and Vs-SB2 with the strong power supply line over the first main surface SAFU1 of the user substrate UR-B.

Moreover, since it is possible to shorten the paths between the respective power supply pad electrodes Vd over the terminal regions CSI0-BD to CSI3-BD and the second external terminals Vd-SB2 and the paths between the respective ground pad electrodes Vs over the terminal regions CSI0-BD to CSI3-BD and the second external terminals Vs-SB2, parasitic inductance can be reduced.

In FIG. 12, for example, the plurality of bump electrodes arranged over the terminal region CSI0-BD are regarded as first terminals and the plurality of bump electrodes arranged over the terminal region CSI1-BD are regarded as second terminals. In this case, the first terminals are connected with the interface circuit CSI0 (first circuit) and the second terminals are connected with the interface circuit CSI1 (second circuit). The first terminals and the second terminals are arranged in accordance with the reference pattern (arrangement pattern) shown in FIG. 7. Even when a modification such as the addition/removal of a lane and/or mirror inversion is added, as long as the power-supply bump electrode rows ED-Vd and BD-Vs and the column including the reference-signal bump electrodes are arranged close to and along the sides of the terminal regions intersecting each other, the same arrangement pattern is obtained. Accordingly, the bump electrodes over the terminal region CSI0-BD and the bump electrodes over the terminal region CSI1-BD include the same arrangement pattern.

The interface circuit CSI0 is arranged closer to the side ED (first side) of the semiconductor chip CH than the interface circuit CSI1. Also, the terminal region CSI0-BD is arranged closer to the side ED than the terminal region CSI1-BD. In the area where the interface CSI0 is close to the interface CSI1, i.e., in the area where the terminal region CSI0 is close to the terminal region CSI1, the first power supply lines Vd-L (Vd-L0) and Vs-L1 (Vs-L10) are formed in the wiring layer, as shown in FIG. 12. Also, in the area where the interface CSI1 is close to the interface CSI0, i.e., in the area where the terminal region CSI1 is close to the terminal region CSI0, the second power supply lines Vd-L (Vd-L1) and Vs-L2 (Vs-L21) are formed in the wiring layer, as shown in FIG. 12. In this case, the bump electrodes Vd and Vs arranged over the terminal region CSI0 are bump electrodes (first power supply terminals) to which the power supply voltage is supplied from the power supply lines (Vd-L0) and (Vs-L10). The bump electrodes Vd and Vs arranged over the terminal region CSI1-BD are bump electrodes (second power supply terminals) to which the power supply voltage is supplied from the power supply lines (Vd-L1) and (Vs-L21).

Also, in FIG. 12, the plurality of bump electrodes arranged over the terminal region CSI2-BD are regarded as third terminals and the plurality of bump electrodes arranged over the terminal region CSI3-BD are regarded as fourth terminals. In this case, the third terminals are connected with the interface circuit CSI2 (third circuit) and the fourth terminals are connected with the interface circuit CSI3 (fourth circuit). The third terminals and the fourth terminals are arranged in accordance with the reference pattern (arrangement pattern) shown in FIG. 7. Accordingly, the bump electrodes over the terminal region CSI2-BD and the bump electrodes over the terminal region CSI3-BD include the same arrangement pattern.

The interface circuit CSI2 is arranged closer to the side ED (first side) of the semiconductor chip CH than the interface circuit CSI3. Also, the terminal region CSI2-BD is arranged closer to the side ED than the terminal region CSI3-BD. In the area where the interface CSI2 is close to the interface CSI3, in the area where the terminal region CSI2 is close to the terminal region CSI3, the first power supply lines Vd-L (Vd-L2) and Vs-L1 (Vs-L12) are formed in the wiring layer, as shown in FIG. 12. Also, in the area where the interface CSI3 is close to the interface CSI2, i.e., in the area where the terminal region CSI3 is close to the terminal region CSI2, the second power supply lines Vd-L (Vd-L3) and Vs-L2 (Vs-L23) are formed in the wiring layer, as shown in FIG. 12. In this case, the bump electrodes Vd and Vs arranged over the terminal region CSI2 are bump electrodes (third power supply terminals) to which the power supply voltage is supplied from the power supply lines (Vd-L2) and (Vs-L12). The bump electrodes Vd and Vs arranged over the terminal region CSI3-BD are bump electrodes (fourth power supply terminals) to which the power supply voltage is supplied from the power supply lines (Vd-L3) and (Vs-L23).

In FIG. 12, the bump electrodes arranged over the terminal region CSI2-BD can be regarded as those obtained by mirror-inverting the bump electrodes arranged over the terminal region CSI0-BD. Accordingly, the arrangement pattern of the bump electrodes over the terminal region CSI0-BD and the arrangement pattern of the bump electrodes over the terminal region CSI2-BD can be regarded as the same arrangement pattern. Likewise, the arrangement pattern of the bump electrodes over the terminal region CSI1-BD and the arrangement pattern of the bump electrodes over the terminal region CSI3-BD can be regarded as the same arrangement pattern.

In the embodiment, each of the interface circuits CSI0 to CSI3 shown in FIG. 5 is configured of a hard macro and has the same function, i.e., the function of the MIPI-CSI standardized interface.

As shown in FIG. 9, each of the terminal regions CSI0-BD to CSI3-BD has the sides CS-U, CS-D, CS-R, and CS-L. The following will describe the relationships between the sides CS-U, CS-D, CS-R, and CS-L and the sides of the semiconductor chip CH. The sides CS-U and CS-D of each of the terminal regions CSI0-BD to CSI3-BD face the sides EU and ED of the semiconductor chip CH and extend in parallel with the sides EU and ED. Also, the sides CS-U and CS-D of each of the terminal regions CSI0-BD to CSI3-BD extend in parallel with the sides EU and ED of the semiconductor chip CH. Also, the sides CS-L and CS-R of each of the terminal regions CSI0-BD to CSI3-BD extend in parallel with the sides EL and ER of the semiconductor chip CH.

<Shielding of Reference Signal>

Figure 13:
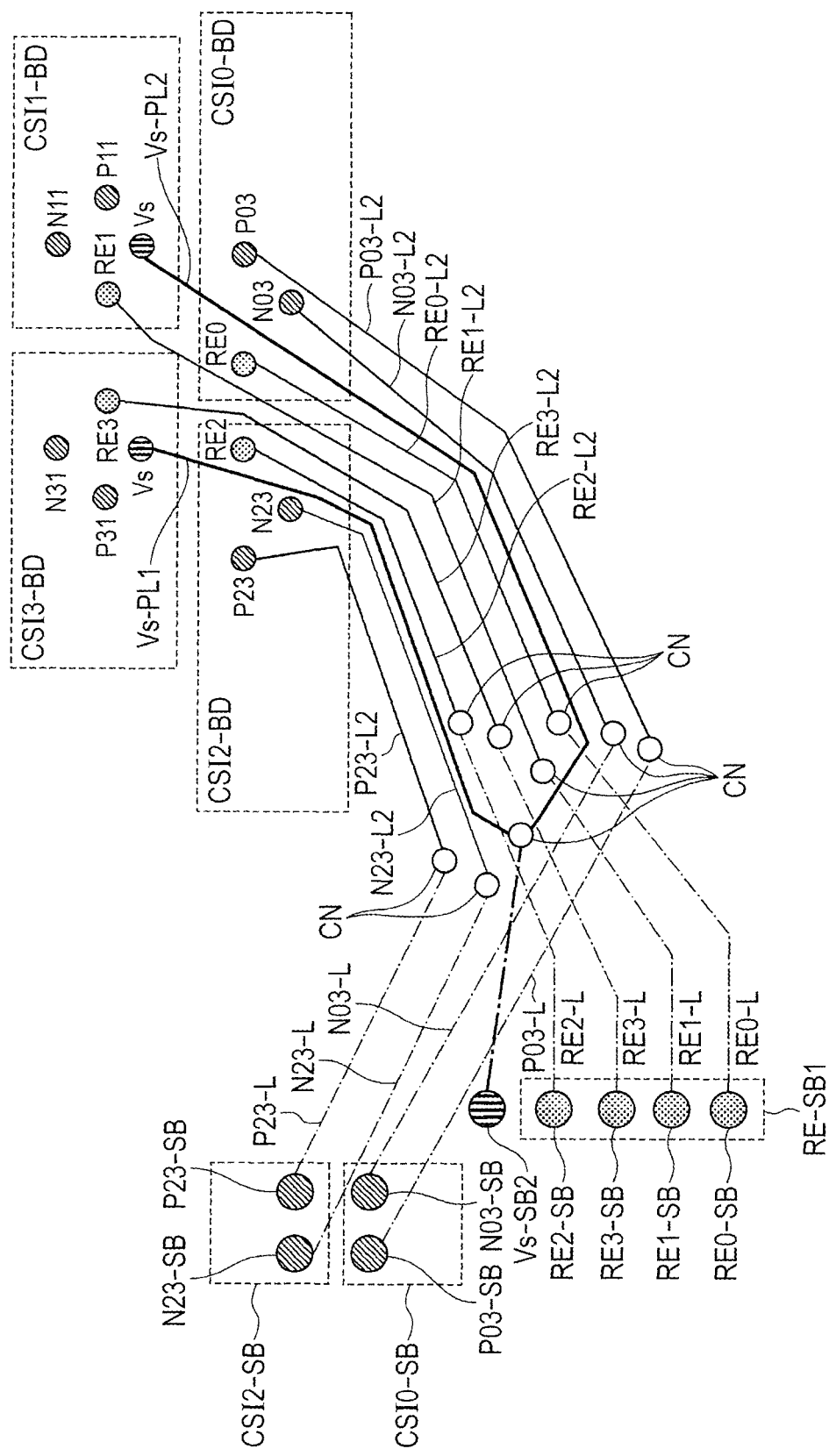
FIG. 13 is a partial plan view of the wiring substrate according to the embodiment.

FIG. 13 is a plan view schematically showing the connection of terminal regions CSI0-BD to CSI3-BD with the second external terminal regions CSI0-SB, CSI2-SB, and RE-SB1. FIG. 13 is a schematic plan view when the semiconductor device SIP is viewed from the first main surface SAFC1 of the semiconductor chip CH in a state where the semiconductor chip CH is mounted over the wiring substrate SIP-B. The drawing particularly shows the signal lines connecting the terminal regions CIS0-BD to CIS3-BD of the second main surface SAFC2 of the semiconductor chip CH with the second external terminal regions CSI0-SB, CSI2-SB, and RE-SB1 of the second main surface SAFS2 of the wiring substrate SIP-B.

In FIG. 13, for easier illustration, only some of the bump electrodes arranged over the terminal regions CIS0-BD to CIS3-BD and some of the second external terminals arranged over the second external terminal regions CSI0-SB and CSI2-SB are shown. That is, over each of the terminal regions CIS0-BD to CIS3-BD, the plurality of bump electrodes are arranged, as illustrated in FIG. 9. However, FIG. 13 shows only the reference-signal bump electrodes RE0 to RE3, the signal bump electrodes N03 and P03, N11 and P11, N23 and P23, and N31 and P31 to each pair of which the pair of differential signals are supplied, and the ground-power-supply bump electrode Vs. Likewise, over each of the second external terminal regions CSI0-SB and CSI2-SB, the plurality of second external terminals are arranged, as illustrated in FIG. 11. However, FIG. 13 shows only the signal second external terminals N03-SB and P03-SB and the signal second external terminals N23-SB and P23-SB which are among these second external terminals illustrated in FIG. 11 and to each pair of which the pair of differential signals are supplied from outside the semiconductor device SIP.

The semiconductor chip CH is mounted over the wiring substrate SIP-B and connected with the bump electrodes of the semiconductor chip and with the first external terminals arranged over the first main surface SAFS1 of the wiring substrate SIP-B. Consequently, the reference-signal bump electrodes RE0 to RE3 arranged respectively over the terminal regions CSI0-BD to CSI3-BD are connected with the second external terminals RE0-SB to RE3-SB in the second external terminal region RE-SB1 which are arranged over the second main surface SAFS2 of the wiring substrate SIP-B. The reference signals are supplied from outside the semiconductor device SIP to the second external terminals RE0-SB to RE3-SB arranged in the second external terminal region RE-SB1 to set the characteristics of the respective differential circuits SA (FIG. 6) included in the interface circuits CSI0 to CSI3.

The signal bump electrodes N03 and P03 arranged over the terminal region CSI0-BD are connected with the signal second external terminals N03-SB and P03-SB arranged in the corresponding second external terminal region CSI0-SB via the signal lines in the wiring substrate SIP-B. Likewise, the signal bump electrodes N23 and P23 arranged over the terminal region CSI2-BD are connected with the signal second external terminals N23-SB and P23-SB arranged in the corresponding second external terminal region CSI2-SB via the signal lines in the wiring substrate SIP-B. Also, the signal bump electrodes N11 and P11 arranged over the terminal region CSI1-BD are connected with the signal second external terminals arranged in the corresponding second external terminal region CSI1-SB via the signal lines in the wiring substrate SIP-B, though not shown in FIG. 13. Likewise, the signal bump electrodes N31 and P31 arranged over the terminal region CSI3-BD are connected with the signal second external terminals arranged in the corresponding second external terminal region CSI3-SB via the signal lines in the wiring substrate SIP-B, though not shown.

In this embodiment, the ground-power-supply bump electrodes Vs arranged in the terminal regions CSI1-BD and CSI3-BD are connected with the ground-power-supply second external terminals Vs-SB2 to which the ground power supply voltage Vs is supplied via the ground-power-supply voltage lines in the wiring substrate SIP-B.

In this embodiment, the respective first external terminals corresponding to the reference-signal bump electrodes RE0 to RE3, i.e., the first external terminals (first external terminal SB1-I4 in the example shown in FIG. 10) connected with the reference-signal bump electrodes RE0 to RE3 via the bumps are connected with signal lines RE0-L2 to RE3-L2 formed of the second metal wiring layer ML2 (FIG. 3) which is among the wiring layers. The signal lines RE0-L2 to RE3-L2 extend to the vicinity of the second external terminal region RE-SB1. In the vicinity of the second external terminal region RE-SB1, openings CN are provided in an interlayer insulating film (e.g., IS2 in FIG. 3) and, via the openings CN, the signal lines RE0-L2 to RE3-L2 are electrically connected with the signal lines RE0-L to RE3-L (dot-dash lines) formed of a metal wiring layer other than the second metal wiring layer. The signal lines RE0-L to RE3-L are electrically connected with the reference-signal second external terminals RE0-SB to RE3-SB arranged in the second external terminal region RE-SB1.

Also, the respective first external terminals corresponding to the signal bump electrodes N03, P03, N23, and P23, i.e., the first external terminals (first external terminals SB1-I3 and SB1-I5 in the example shown in FIG. 10) connected with the reference-signal bump electrodes N03, P03, N23, and P23 via the bumps are connected with signal lines N03-L2, P03-L2, N23-L2, and P23-L2 formed of the second metal wiring layer ML2 (FIG. 3) in the wiring layer. The signal lines N03-L2, P03-L2, N23-L2, and P23-L2 extend to the vicinities of the second external terminal regions CSI0-SB and CSI2-SB. In the vicinities of the second external terminal regions CSI0-SB and CSI2-SB, the openings CN are provided in an interlayer insulating film (e.g., IS2 in FIG. 3) and, via the openings CN, the signal lines N03-L2, P03-L2, N23-L2, and P23-L2 are connected with signal lines N03-L, P03-L, N23-L, and P23-L (dot-dash lines) each formed of a metal wiring layer other than the second metal wiring layer. The signal lines N03-L, P03-L, N23-L, and P23-L are electrically connected with the signal second external terminals N03-SB, P03-SB, N23-SB, and P23-SB arranged in the second external terminal regions CSI0-SB and CSI2-SB.

The other signal bump electrodes in the terminal regions CSI0-BD to CSI3-BD are also electrically connected with the corresponding signal second external terminals, similarly to the signal bump electrodes N03, P03, N23, and P23.

In the embodiment, the respective first external terminals corresponding to the ground-power-supply bump electrodes Vs arranged over the terminal region CSI3-BD and to the ground-power-supply bump electrodes Vs arranged over the terminal region CSI1-BD are connected with ground power supply lines Vs-PL1 and Vs-PL2 (thick solid lines) each formed of the second metal wiring layer ML2 (FIG. 3) which is among the wiring layers. The ground power supply lines Vs-PL1 and Vs-PL2 extend to the vicinity of, e.g., the second external terminal region RE-SB1. In the vicinity of the second external terminal region RE-SB1, the openings CN are provided in an interlayer insulating film (e.g., LS2 in FIG. 3) and, via the opening CN, the ground power supply lines Vs-PL1 and Vs-PL2 are electrically connected with a ground power supply line (thick dot-dash line) formed of a metal wiring layer other than the second metal wiring layer. The ground power supply line is electrically connected with the ground-power-supply second external terminal Vs-SB2 arranged close to the second external terminal region RE-SB1.

Although FIG. 13 is schematic, the arrangement of the signal lines RE0-L2 to RE3-L2, N03-L2, P03-L2, N23-L2, and P23-L2, and the ground power supply lines Vs-PL1 and Vs-PL2 is illustrated in accordance with the real arrangement thereof. That is, when the second metal wiring layer ML2 is viewed from the first main surface SAFC1 of the semiconductor chip CH, the ground power supply lines Vs-PL1 and Vs-PL2 (first and second voltage lines) are placed between the signal lines N03-L2, P03-L2, N23-L2, and P23-L2 which transmit the pairs of differential signals and the signal lines RE0-L2 to RE3-L2 which transmit the reference signals. In other words, when the signal lines and the ground power supply lines in the second metal wiring layer ML2 are viewed in plan view, the signal lines which transmit the reference signals are interposed between the ground power supply lines which supply the ground power supply voltage (predetermined voltage) so as to be isolated from the signal lines which transmit the differential signals. In this case, between the ground power supply lines Vs-PL1 and Vs-PL2 which supply the ground power supply voltage, only the signal lines which transmit the reference signals are placed and the signal lines which transmit signals such as the differential signals are not placed.

As a result, even when the differential signals change, it is possible to prevent the reference signals from changing. That is, the signal lines which transmit the reference signals are shielded by the ground power supply lines Vs-PL1 and Vs-PL2.

Also, in the embodiment, when viewed from the first main surface SAFC1 of the semiconductor chip CH, in the first metal wiring layer ML1, the ground power supply lines are formed in the regions overlapping the signal lines RE0-L2 to RE3-L2 which transmit the reference signals. In the third metal wiring layer ML3 also, the ground power supply lines are formed in the regions overlapping the signal lines RE0-L2 to RE3-L2 which transmit the reference signals. With the ground power supply lines, the ground-power-supply second external terminals Vs-SB2 are connected so as to supply a ground power thereto. Thus, the signal lines RE0-L2 to RE3-L2 which transmit the reference signals are also shielded from signal changes from the upper and lower layers.

For improved clarity of illustration, the signal lines and the ground power supply lines shown by the dot-dash lines are illustrated relatively long in FIG. 13. However, since the openings CN are located in the vicinities of the second external terminal regions as described above, the signal lines and the ground power supply lines shown by the dot-dash lines are actually shorter.

In the embodiment, in each of the terminal regions CSI0-BD to CSI3-BD, the reference-signal bump electrode columns BD-RE in which the reference-signal bump electrodes are arranged are close to each other. As a result, the reference-signal bump electrodes RE0 to RE3 are closely arranged over the second main surface SAFC2 of the semiconductor chip CH. Consequently, it is possible to place the signal lines RE0-L2 to RE3-L2 which transmit the reference signals close to each other in the wiring substrate SIP-B. This allows the signal lines RE0-L2 to RE3-L2 to be collectively placed between the two ground power supply lines Vs-PL1 and Vs-PL2. Therefore, it is possible to prevent the size of the wiring substrate SIP-B from increasing, while preventing the characteristics of the interface circuits from changing.

Note that, in the example shown in FIG. 13, the ground power supply lines Vs-PL1 and Vs-PL2 are connected with the ground-power-supply bump electrodes Vs arranged over the terminal regions CSI1-BD and CSI3-BD. However, the connecting relations of the ground power supply lines Vs-PL1 and Vs-PL2 are not limited thereto.

<Interface Circuit LVDS>

Figure 14:
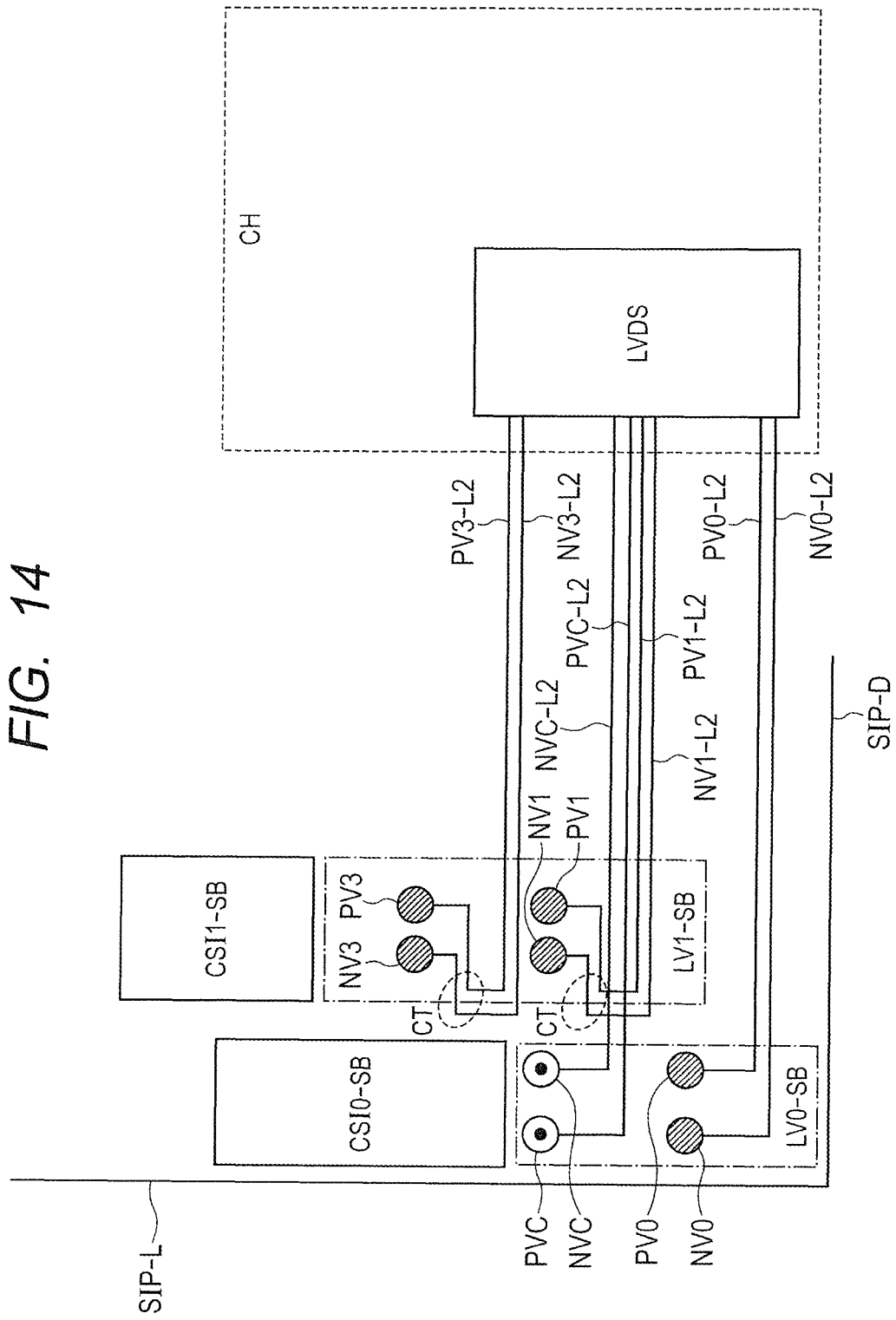
FIG. 14 is a partial plan view of the wiring substrate according to the embodiment.

FIG. 14 is a plan view schematically showing the connections of the terminal regions LV0-SB and LV1-SB with the semiconductor chip CH. FIG. 14 is a schematic plan view when the semiconductor device SIP is viewed from the first main surface SAFC1 of the semiconductor chip CH in a state where the semiconductor chip CH is mounted over the wiring substrate SIP-B. In the drawing, the signal lines between the interface circuit LVDS formed in the semiconductor chip CH and the signal second external terminals and the clock-signal second external terminals in the second external terminal regions LV0-SB and LV1-SB of the wiring substrate SIP-B are particularly illustrated.

In this embodiment, as shown in FIG. 11, the second external terminal regions corresponding to the interface circuit LVDS are arranged in two zones which are arranged in a direction toward the center portion (inner portion) of the wiring substrate SIP-B on the basis of the side SIP-L of the wiring substrate SIP-B. In the example shown in FIG. 11, the two pairs of signal second external terminals NV0 and PV0 and NVC and PVC are arranged over the second external terminal region LV0-SB. However, in FIG. 14, for improved clarity of illustration, the pair of signal second external terminals NV1 and PV1 are omitted.

The bump electrodes corresponding to the interface circuit LVDS formed in the semiconductor chip CH are connected with the corresponding first external terminals over the first main surface SAFS1 of the wiring substrate SIP-B. The first external terminals connected with the bump electrodes of the interface circuit LVDS are connected with the signal lines formed of the second metal wiring layer through the openings. The signal lines are electrically connected with the clock-signal second external terminals PVC and NVC and the signal second external terminals PVC, NV0, PV1, NV1, PV3, and NV3 arranged in the corresponding second external terminal regions LV0-SB and LV1-SB through the openings located in the vicinities of the second external terminal regions LV0-SB and LV1-SB and via the signal lines formed of another metal wiring layer.

In FIG. 14, of the signal lines connecting the interface circuit LVDS with the second external terminals PVC, NV0, PV1, NV1, PV3, and NV3, those formed of the second metal wiring layer ML2 are denoted by PVC-L2, NVC-L2, PV0-L2, NV0-L2, PV1-L2, NV1-L2, PV3-L2, and NV3-L2. That is, of the signal lines which transmit the clock signals, those formed of the second metal wiring layer ML2 are denoted by PVC-L2 and NVC-L2. Also, of the signal lines which transmit the three pairs of differential signals, those formed of the second metal wiring layer ML2 are denoted by PV0-L2, NV0-L2, PV1-L2, NV1-L2, PV3-L2, and NV3-L2.

FIG. 14 is a schematic view, but the signal lines PVC-L2, NVC-L2, PV0-L2, NV0-L2, PV1-L2, NV1-L2, PV3-L2, and NV3-L2 formed of the second metal wiring layer ML2 are illustrated in accordance with the real signal lines PVC-L2, NVC-L2, PV0-L2, NV0-L2, PV1-L2, NV1-L2, PV3-L2, and NV3-L2.

The signal lines PVC-L2 and NVC-L2 which connect the interface circuit LVDS with the clock-signal second external terminals PVC and NVC are placed so as to linearly connect the interface circuit LVDS with the clock-signal second external terminals PVC and NVC. Likewise, the signal lines PV0-L2 and NV0-L2 which connect the interface circuit LVDS with the signal second external terminals PVC) and NV0 are also placed so as to linearly connect the interface circuit LVDS with the signal second external terminals PVC) and NV0. By contrast, each of the signal lines PV1-L2, NV1-L2, PV3-L2, and NV3-L2 connecting the interface circuit LVDS with the signal second external terminals PV1, NV1, PV3, and NV includes a bent-back portion CT. That is, each of the signal lines PV1-L2, NV1-L2, PV3-L2, and NV3-L2 extends through the bent-back portion to connect the interface circuit with the signal second external terminals.

When viewed from the first main surface SAFC1 of the semiconductor chip CH, the signal second external terminals PV1, NV1, PV3, and NV3 are arranged closer to the semiconductor chip CH than the second external terminal region LV0-SB where the signal second external terminals PVC and NV0 and the clock-signal second external terminals PVC and NVC are arranged. Accordingly, when the signal lines PV1-L2, NV1-L2, PV3-L2, and NV3-L2 are linearly placed similarly to the signal lines PV0-L2, NV0-L2, PVC-L2, and NVC-L2, respective delays caused by the signal lines in the signals transmitted thereby become substantially equal. For example, when a consideration is given to the case where, e.g., differential signals are output from the interface circuit LVDS to the second external terminals in synchronization with the clock signals, the signals change at the second external terminals PV1, NV1, PV3, and NV3 at a time before the clock signals change at the clock-signal second external terminals PVC and NVC.

By contrast, in this embodiment, each of the signal lines PV1-L2, NV1-L2, PV3-L2, and NV3-L2 has the bent-back portion CT. This allows the timing of signal changes at the second external terminals PV1, NV1, PV3, and NV3 to be delayed. As a result, even though the second external terminals corresponding to the interface circuit LVDS are arranged in two zones, it is possible to cause signal changes at the second external terminals PV0, NV0, PV1, NV1, PV3, and NV3 in accordance with clock signal changes at the clock-signal second external terminals PVC and NVC and reduce the occurrence of an erroneous operation.

Note that the reference signals supplied to the reference-signal second external terminals RE0-SB to RE3-SB are static signals which do not change with the lapse of time. The reference signals are formed by, e.g., providing resistive elements corresponding to the respective reference-signal second external terminals RE0-SB to RE3-SB in the second main surface SAFU2 of the user substrate UR-B, generating a bias current for each of the resistive elements over the semiconductor chip CH or the user substrate UR-B, and supplying the bias current to each of the resistive elements. By performing shielding as illustrated in FIG. 13, it is possible to inhibit the static signals from fluctuating and inhibit a size increase.

While the invention achieved by the present inventors has been specifically described heretofore on the basis of the embodiments thereof, the present invention is not limited to the foregoing embodiments. It will be appreciated that various changes and modifications can be made in the invention within the scope not departing from the gist thereof. For example, the CH1 to CH5 mounted over the wiring substrate SIP-B have been described using the semiconductor packages as an example, but may also be semiconductor chips similarly to the CH.

What is claimed is:
1. A semiconductor device, comprising:
a semiconductor chip having a quadrangular shape in plan view, and including a first circuit, a second circuit, a first main surface, a second main surface opposite and facing the first main surface, a plurality of first terminals formed two-dimensionally over the second main surface and connected with the first circuit, and a plurality of second terminals formed two-dimensionally over the second main surface and connected with the second circuit;
a wiring substrate including a first main surface over which a plurality of first external terminals are arranged, a wiring layer, and a second main surface over which a plurality of second external terminals are arranged, the second main surface being opposite to the first main surface via the wiring layer; and
a conductive member connecting the first and second terminals with the first external terminals by mounting the semiconductor chip over the first main surface of the wiring substrate such that the second main surface of the semiconductor chip faces the first main surface of the wiring substrate,
wherein, when viewed from the first main surface of the semiconductor chip, an arrangement pattern of the first terminals and an arrangement pattern of the second terminals include the same arrangement pattern,
wherein, when viewed from the first main surface of the semiconductor chip, the first circuit is arranged so as to be closer to a first side of the semiconductor chip than the second circuit,
wherein the first terminals include a first power supply terminal which supplies a power supply voltage to the first circuit and the second terminals include a second power supply terminal which supplies the power supply voltage to the second circuit, and
wherein, when viewed from the first main surface of the semiconductor chip, in a region of the first circuit which is close to the second circuit, a first power supply line which supplies the power supply voltage to the first power supply terminal is formed in the wiring layer, and, in a region of the second circuit which is close to the first circuit, a second power supply line which supplies the power supply voltage to the second power supply terminal is formed in the wiring layer.
2. The semiconductor device according to claim 1, wherein the first power supply terminal is arranged in a region where the first circuit and the first power supply line overlap each other and the second power supply terminal is arranged in a region where the second circuit and the second power supply line overlap each other.
3. The semiconductor device according to claim 2, wherein the semiconductor chip further includes a third circuit, a fourth circuit, a plurality of third terminals formed two-dimensionally over the second main surface of the semiconductor chip and connected with the third circuit, and a plurality of fourth terminals formed two-dimensionally over the second main surface of the semiconductor chip and connected with the fourth circuit,
wherein, when viewed from the first main surface of the semiconductor chip, an arrangement pattern of the third terminals and an arrangement pattern of the fourth terminals include the same arrangement pattern,
wherein, when viewed from the first main surface of the semiconductor chip, the third circuit is arranged so as to be closer to the first side of the semiconductor chip than the fourth circuit,
wherein the third terminals include a third power supply terminal which supplies the power supply voltage to the third circuit and the fourth terminals include a fourth power supply terminal which supplies the power supply voltage to the fourth circuit, and
wherein, when viewed from the first main surface of the semiconductor chip, in a region of the third circuit which is close to the fourth circuit, the third power supply terminal is arranged so as to overlap the first power supply line, in a region of the fourth circuit which is close to the third circuit, the fourth power supply terminal is arranged so as to overlap the second power supply line, and the first and second power supply lines supply the power supply voltage to the third and fourth circuits.
4. The semiconductor device according to claim 3, wherein the arrangement pattern of the first terminals and the arrangement pattern of the third terminals are identical and the arrangement pattern of the second terminals and the arrangement pattern of the fourth terminals are identical.
5. The semiconductor device according to claim 4, wherein the semiconductor chip further includes:
a second side facing the first side;
a third side intersecting the first and second sides;
a fourth side facing the third side and intersecting the first and second sides; and
a plurality of corner portions formed by the first, second, third, and fourth sides intersecting each other, and
wherein the first, second, third, and fourth circuits are arranged in a region close to the one of the corner portions which is formed by the first and third sides.
6. The semiconductor device according to claim 5, wherein the first, second, third, and fourth circuits have the same function.
7. The semiconductor device according to claim 1, wherein the first terminals include a first reference terminal to which a reference signal is supplied and the reference signal supplied to the first reference terminal sets a characteristic of the first circuit,
wherein the second terminals include a second reference terminal to which the reference signal is supplied and the reference signal supplied to the second reference terminal sets a characteristic of the second circuit,
wherein the wiring layer include first and second signal lines each formed in the wiring layer closer to the second main surface of the wiring substrate than the wiring layer in which the first and second power supply lines are formed, a first voltage line to which a predetermined voltage is supplied, and a second voltage line to which a predetermined voltage is supplied, and wherein the first and second signal lines are placed so as to be interposed between the first and second voltage lines, the first signal line is connected with the first reference terminal, the second signal line is connected with the second reference terminal, and only the signal lines which transmits the reference signal are placed between the first and second voltage lines.

8. A semiconductor device, comprising:

a semiconductor chip including a first circuit, a second circuit, a first main surface, a second main surface opposite and facing the first main surface, a plurality of first terminals formed two-dimensionally over the second main surface and connected with the first circuit, and a plurality of second terminals formed two-dimensionally over the second main surface and connected with the second circuit; and a wiring substrate including a first main surface over which a plurality of first external terminals are arranged, a wiring layer including a plurality of conductive wiring layers, and a second main surface over which a plurality of second external terminals are arranged, the second main surface being opposite to the first main surface via the wiring layer, the semiconductor chip being mounted over the first main surface of the wiring substrate such that the second main surface of the semiconductor chip faces the first main surface of the wiring substrate, the first terminals and the second terminals being connected with the first external terminals, wherein, when viewed from the first main surface of the semiconductor chip, the first terminals are arranged in a first terminal region including first and second region sides facing each other and third and fourth region sides respectively intersecting the first and second region sides and facing each other, wherein, when viewed from the first main surface of the semiconductor chip, the second terminals are arranged in a second terminal region including fifth and sixth region sides facing each other and seventh and eighth regions sides respectively intersecting the fifth and sixth region sides and facing each other, wherein the first and second terminal regions are arranged such that, when viewed from the first main surface of the semiconductor chip, the first region side of the first terminal region and the second region side of the second terminal region face each other, wherein the first terminals arranged along the first region side in an area of the first terminal region which is close to the first region side when viewed from the first main surface of the semiconductor chip are used as a plurality of first power supply terminals to which a power supply voltage for operating the first circuit is supplied and the second terminals arranged along the fifth region side in an area of the second terminal region which is close to the fifth region side when viewed from the first main surface of the semiconductor chip are used as a plurality of second power supply terminals to which the power supply voltage for operating the second circuit is supplied, and wherein the wiring layer include a first power supply line placed so as to overlap the first power supply terminals when viewed from the first main surface of the semiconductor chip and supply the power supply voltage to the first power supply terminals and a second power supply line placed so as to overlap the second power supply terminals when viewed from the first main surface of the semiconductor chip and supply the power supply voltage to the second power supply terminals.

9. The semiconductor device according to claim 8, wherein the second main surface of the semiconductor chip includes first and second sides facing each other and third and fourth sides respectively intersecting the first and second sides and facing each other when viewed from the first main surface of the semiconductor chip, wherein, when viewed from the first main surface of the semiconductor chip, the first and second region sides of the first terminal region and the fifth and sixth region sides of the second terminal region extend so as to be parallel with the first and second sides of the second main surface and the third and fourth region sides of the first terminal region and the seventh and eighth region sides of the second terminal region extend so as to be parallel with the third and fourth sides of the second main surface, wherein, when viewed from the first main surface of the semiconductor chip, the first region side of the first terminal region is located closer to the first side of the second main surface than the fifth region side of the second terminal region, wherein, when viewed from the first main surface of the semiconductor chip, the third region side of the first terminal region is located closer to the third side of the second main surface than the fourth region side and the seventh region side of the second terminal region is located closer to the third side of the second main surface than the eighth region side, wherein the first terminal arranged close to the third region side of the first terminal region is used as a first reference terminal which supplies a reference signal for setting a characteristic of the first circuit and the second terminal arranged close to the seventh region side of the second terminal region is used as a second reference terminal which supplies the reference signal for setting a characteristic of the second circuit, wherein the wiring layer include first and signal lines each formed of a predetermined one of the conductive wiring layers, and first and second voltage lines placed such that the first and second signal lines are interposed therebetween when viewed from the first main surface of the semiconductor chip, and wherein the first signal line is connected with the first reference terminal, the second signal line is connected with the second reference terminal, and a predetermined voltage is supplied to each of the first and second voltage lines.

10. The semiconductor device according to claim 9, wherein the first circuit includes a first differential circuit to which a pair of differential signals are supplied via a pair of the first terminals which are among the first terminals, and wherein the wiring layer include a pair of signal lines each formed of the predetermined conductive wiring layer and, when viewed from the first main surface of the semiconductor chip, the first voltage line is placed between the pair of signal lines and the first and second signal lines.

11. The semiconductor device according to claim 9, wherein the first and second circuits have the same function.

12. A semiconductor device, comprising:
a semiconductor chip including a first main surface, a second main surface opposite to the first main surface and having a quadrangular shape in plan view, a first hard macro having a differential circuit, a second hard macro having a differential circuit, a plurality of first bump electrodes connected with the first hard macro and arranged two-dimensionally over the second main surface, and a plurality of second bump electrodes connected with the second hard macro and arranged two-dimensionally over the second main surface; and
a wiring substrate including a first main surface over which the semiconductor chip is mounted so as to face the second main surface of the semiconductor chip, wiring layer, and a second main surface opposite to the first main surface over which the semiconductor chip is mounted, via the wiring layer,
wherein, when viewed from the first main surface of the semiconductor chip, the first and second hard macros are arranged over the second main surface of the semiconductor chip so as to be interposed between first and second sides of the semiconductor chip facing each other and the first hard macro is arranged closer to the first side than the second hard macro,
wherein, when viewed from the first main surface of the semiconductor chip, the first bump electrodes and the second bump electrodes are arranged so as to be interposed between the first and second sides and the first bump electrodes are arranged closer to the first side than the second bump electrodes,
wherein, when viewed from the first main surface of the semiconductor chip, those of the first bump electrodes arranged two-dimensionally which are close to the second bump electrodes arranged two-dimensionally are used as the first bump electrodes which supply a power supply voltage for operating the first hard macro and those of the second bump electrodes arranged two-dimensionally which are close to the first bump electrodes arranged two-dimensionally are used as the second bump electrodes which supply the power supply voltage for operating the second hard macro, and
wherein, when viewed from the first main surface of the semiconductor chip, the wiring layer include a first power supply line which is placed so as to overlap the first bump electrodes which supply the power supply voltage and transmits the power supply voltage to be supplied to the first hard macro and a second power supply line which is placed so as to overlap the second bump electrodes which supply the power supply voltage and transmits the power supply voltage to be supplied to the second hard macro.

13. The semiconductor device according to claim 12,
wherein, when viewed from the first main surface of the semiconductor chip, the one of the first bump electrodes arranged two-dimensionally which is arranged close to a third side of the second main surface of the semiconductor chip is used as the first bump electrode which supplies a reference signal to the first hard macro,
wherein, when viewed from the first main surface of the semiconductor chip, the one of the second bump electrodes arranged two-dimensionally which is arranged close to the third side of the second main surface of the semiconductor chip is used as the second bump electrode which supplies the reference signal to the second hard macro,
wherein the wiring layer include a predetermined conductive wiring layer in which a first signal line connected with the first bump electrode which supplies the reference signal, a second signal line connected with the second bump electrode which supplies the reference signal, a first voltage line to which a predetermined voltage is supplied, and a second voltage line to which the predetermined voltage is supplied are formed, and
wherein, when viewed from the first main surface of the semiconductor chip, the first and second voltage lines are placed in the wiring layer such that the first and second signal lines are interposed therebetween.

14. The semiconductor device according to claim 13,
wherein the first and second hard macros have the same function.

* * * * *